(12) United States Patent
Nishi

(10) Patent No.: US 6,396,568 B1
(45) Date of Patent: May 28, 2002

(54) EXPOSURE APPARATUS AND METHOD

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/410,740

(22) Filed: Oct. 1, 1999

Related U.S. Application Data

(62) Division of application No. 08/867,901, filed on Jun. 3, 1997, now abandoned.

(30) Foreign Application Priority Data

Jun. 4, 1996 (JP) .............................................. 8-141318
Jun. 4, 1996 (JP) .............................................. 8-141319

(51) Int. Cl.[7] ........................ G03B 27/72; G03B 27/42; G03B 27/54
(52) U.S. Cl. .............................. 355/71; 355/53; 355/67
(58) Field of Search ........................ 355/53, 55, 67–71, 355/77; 356/399–401; 430/311, 5, 22, 30; 250/548, 205

(56) References Cited

U.S. PATENT DOCUMENTS

| | | | |
|---|---|---|---|
| 4,355,892 A | 10/1982 | Mayer et al. ................... | 355/77 |
| 4,500,615 A | 2/1985 | Iwai .............................. | 430/30 |
| 4,943,733 A | 7/1990 | Mori et al. .................... | 250/548 |
| 4,965,630 A | 10/1990 | Kato et al. ..................... | 355/52 |
| 5,448,332 A | 9/1995 | Sakakibara et al. ........... | 355/53 |
| 5,591,958 A | 1/1997 | Nishi et al. ................... | 250/205 |
| 5,739,898 A | 4/1998 | Ozawa et al. .................. | 355/53 |
| 5,756,242 A | 5/1998 | Koizumi et al. ............... | 430/30 |
| 5,825,043 A | * 10/1998 | Suwa ............................ | 250/548 |
| 6,034,378 A | * 3/2000 | Shiraishi ................. | 250/559.29 |
| 6,100,961 A | * 8/2000 | Shiraishi et al. .............. | 355/67 |

FOREIGN PATENT DOCUMENTS

| | | |
|---|---|---|
| EP | 0 470 541 A1 | 2/1992 |
| EP | 0 576 297 A1 | 12/1993 |
| JP | 61-091662 | 5/1986 |
| JP | 220990 | 1/1994 |
| JP | 07-029810 | 1/1995 |
| JP | 07-321022 | 12/1995 |

OTHER PUBLICATIONS

Shinichi Nakamura, et al., Image Quality of Higher NA i–line Projection Lens, SPIE vol. 1264, Optical/Laser Microlithography III (1990), pp. 84–93.

Hiroaki Kawata, et al., Optical Projection Lithography Using Lenses With Numerical Apertures Greater Than Unity, Microelectronic Engineering, May 9, 1989, Nos. 1–4, Amsterdam, NL., pp. 31–36.

Daniel C. Cole et al., Extending Scalar Aerial Image Calculations to Higher Numerical Apertures, Journal of Vacuum Science & Technology B 10(6) Nov./Dec. 1992, New York, U.S., pp. 3037–3041.

* cited by examiner

Primary Examiner—Alan A. Mathews
Assistant Examiner—Henry Hung Nguyen
(74) Attorney, Agent, or Firm—Morgan, Lewis & Bockius LLP

(57) ABSTRACT

A method for manufacturing a projection exposure apparatus that exposes a pattern formed on a mask onto a substrate includes the steps of providing a projection optical system having a numerical aperture greater than about 0.7 on an optical-axis between the mask and the substrate and providing an illumination system, which is arranged on the optical axis at an opposite side of the projection optical system with respect to the mask, and which illuminates the pattern formed on the mask with an illumination beam so that the pattern is projected onto the substrate treated by planarization process through the projection optical system.

68 Claims, 18 Drawing Sheets

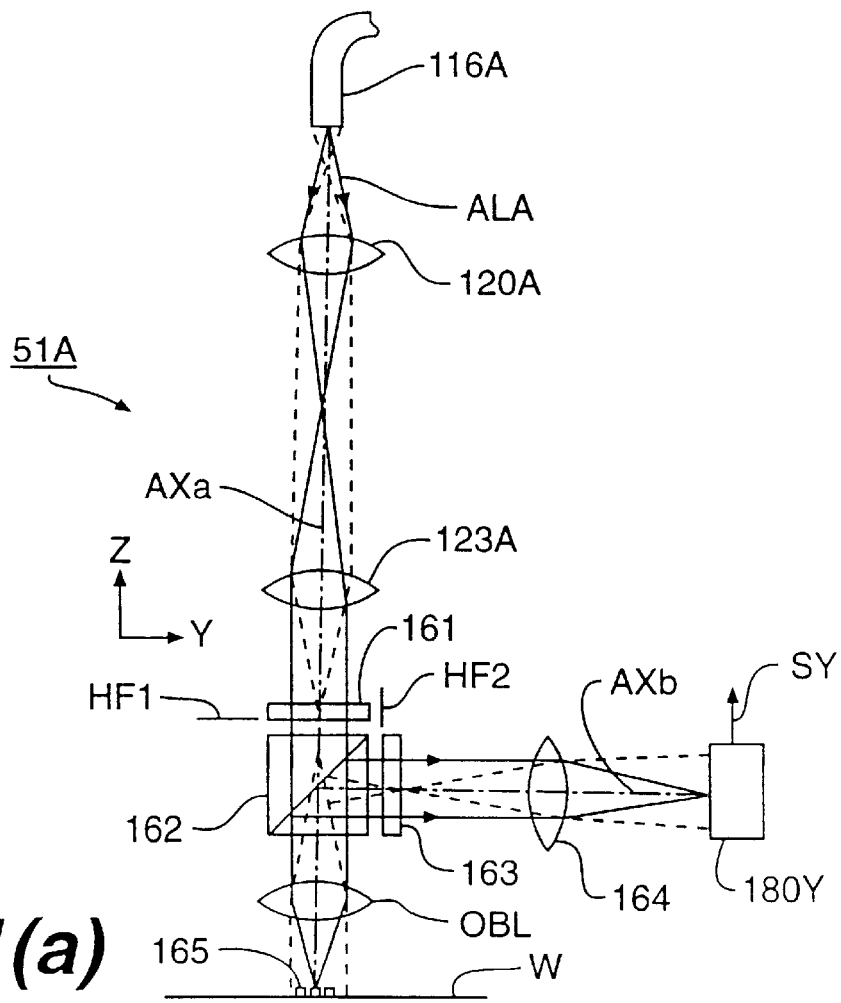
FIG. 11(a)
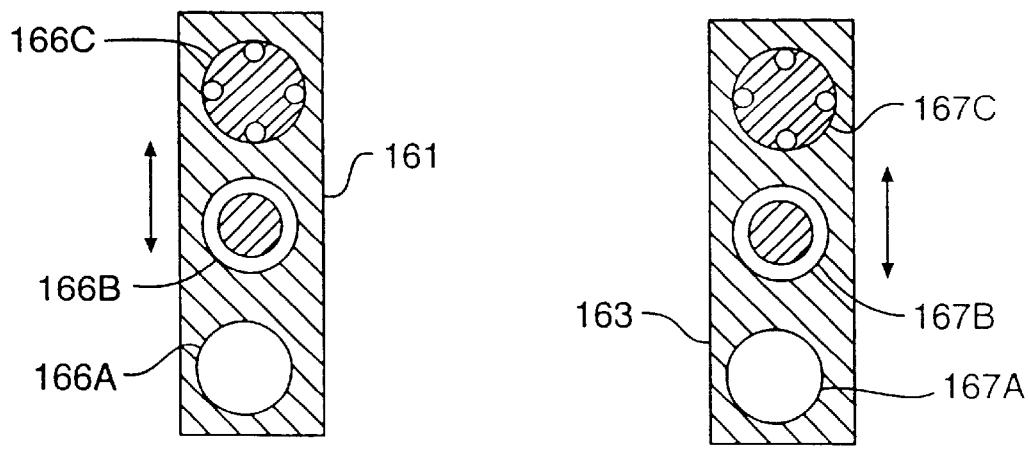
FIG. 11(b)     FIG. 11(c)

EXPOSURE APPARATUS AND METHOD

This is a divisional of application Ser. No. 08/867,901 filed on Jun. 3, 1997 now abandon (CPA filed Jun. 10, 1999).

FIELD OF THE INVENTION

This invention relates to an exposure method and an exposure device for transferring a mask pattern to a photosensitive substrate during a photolithography process for manufacturing such things as semiconductor elements, imaging elements (such as CCDs), liquid crystal display elements, or thin-film magnetic heads.

DISCUSSION OF THE RELATED ART

During the manufacture of semiconductor elements an exposure device transfers an image of a pattern to a reticle. The reticle which acts as a mask, transfers the image to a wafer which is coated with photoresist, forming a photosensitive substrate by the projection exposure system. In the past, projection exposure devices of the collective exposure type, such as steppers, have been used as exposure devices. In recent years the projection exposure method of the scanning exposure type, such as the step-and-scan method where a reticle and a wafer is scanned in sync by the projection exposure system which allows the transfer of large-area patterns without overly stressing the projection exposure system has been gaining attention.

FIG. 13 shows a schematic diagram of an example of a conventional projection exposure device, where the illumination light from the illumination optical system 101 illuminates the pattern formation region of the pattern formation surface (bottom surface) of the reticle (R). Under that illumination light, the projection image, where the pattern is formed upon reticle (R) is reduced a designated magnification by the projection exposure system 102, exposes the photoresist coated on wafer (W) under the illumination light. The numerical aperture of projection exposure system 102 is defined by the aperture diaphragm 103. By developing the photoresist, the projected image appears as a raised resist pattern. However, to increase the resolution of the image, has in the past, required expensive and inconvenient light sources and exposure devices.

SUMMARY OF THE INVENTION

Accordingly, the present invention is directed to a projection exposure apparatus and method that substantially obviates one or more of the problems due to limitations and disadvantages of the related art.

To achieve these and other advantages and in accordance with the purpose of the present invention, as embodied and broadly described, a projection exposure method includes the steps of illuminating a transfer pattern and forming an image of the transfer pattern upon a mask for exposure from an illumination light and transfer exposing the image of the pattern of the mask under the illumination light onto a photosensitive surface. Selectively switching between a normal illumination condition and a modified illumination condition based upon a numerical aperture of the illumination light, wherein the normal illumination condition occurs when a light quantity distribution at an illumination pupil plane is in a first region including an optical-axis, and the modified illumination condition occurs when the light quantity distribution at the illumination pupil plane is in a second region not including the optical-axis.

A further object of the invention is to provide a projection exposure apparatus and method for illuminating a transfer pattern and forming an image of the transfer pattern upon a mask for exposure from an illumination light and transfer exposing the image of the pattern of the mask under the illumination light. Switching a projection condition for changing a numerical aperture of the illumination light and switching an illumination condition between multiple illumination conditions, wherein a normal illumination condition occurs when a light quantity distribution at an illumination pupil plane is in a first region including an optical-axis, and a modified illumination condition occurring when the light quantity distribution at the illumination pupil plane is in a second region not including the optical-axis.

Another object of the present invention is to provide a luminous flux splitting system which splits the illumination light for exposure into a first and a second luminous flux wherein the first luminous flux magnification system, for spreading a cross section of the first luminous flux in a ring shape, and a second luminous flux magnification system for spreading a cross section of the second luminous flux in a ring shape; and a luminous flux synthesis system which synthesizes the luminous flux from the first and second luminous flux systems in front of the illumination pupil plane, wherein the switching of the illumination condition guides the luminous flux synthesized in the luminous flux synthesis system to the illumination system pupil system and carries out an annular illumination when the modified illumination condition is set.

A still further object of the present invention provides a projection exposure apparatus and method for illuminating a transfer pattern and forming an image of the transfer pattern upon a mask for exposure from an illumination light and transfer exposing on a photosensitve circuit board, from an illumination light, detecting an image of a position matching mark on the photosensitive substrate under the illumination light, position matching and aligning the photosensitive substrate based on a detection result, transferring the image formed on the mask and exposing the photosensitive substrate under the illumination light, and switching an alignment optical system between two detection conditions based upon a numerical aperture of the illumination light, wherein the projection exposure system is equipped with two condition detectors, a normal condition detector where an imaging luminous flux is uniformly transmitted on an alignment system pupil plane and an outline emphasis detector, which carries out outline emphasis by transmitting the imaging luminous flux at a designated distribution on the alignment system pupil plane.

A still further object of the present invention provides a projection exposure apparatus and method for transferring a transfer pattern by an exposure illumination light onto a mask, transfer exposing the transfer pattern onto a circuit board coated with a photosensitive material under the exposure illumination light for exposure, controlling an integrated exposure quantity of the exposure illumination light according to the thickness of the photosensitive material coated on the circuit board.

A final object of the present invention provides a projection exposure method including the steps of transferring a transfer pattern by an exposure illumination light onto a mask, transfer exposing the transfer pattern onto a circuit board coated with a photosensitive material under the exposure illumination light for exposure, controlling a switching operation of a numerical aperture of the projection exposure system according to thickness of the photosensitive material coated on the circuit board.

DESCRIPTION OF THE DRAWINGS

FIG. 11(a) depicts a simplified schematic diagram by removal of the mirrors from the (FIA) system 51A of FIG. 9;

FIG. 11(b) depicts illumination system aperture diaphragm plate 161 with the normal σ diaphragm 166A, annular σ diaphragm 166B, and modified σ diaphragm 167C comprised of four circular aperture offsets from the optical-axis;

FIG. 11(c), depicts illumination system aperture diaphragm plate 161 with the normal σ diaphragm 167A, annular σ diaphragm 167B, and modified σ diaphragm 167C comprised of four circular aperture offsets from the optical-axis;

DETAILED DESCRIPTION OF THE PREFERRED EMBODIMENTS

The resolution R and depth of focus (D) of the image of a pattern on reticle (R), which is image projected on the wafer (W) is given by the following equations:

$$R = k_1 * \lambda / NA \tag{1}$$

$$D = k_2 * \lambda / NA^2 \tag{2}$$

Figure 13:
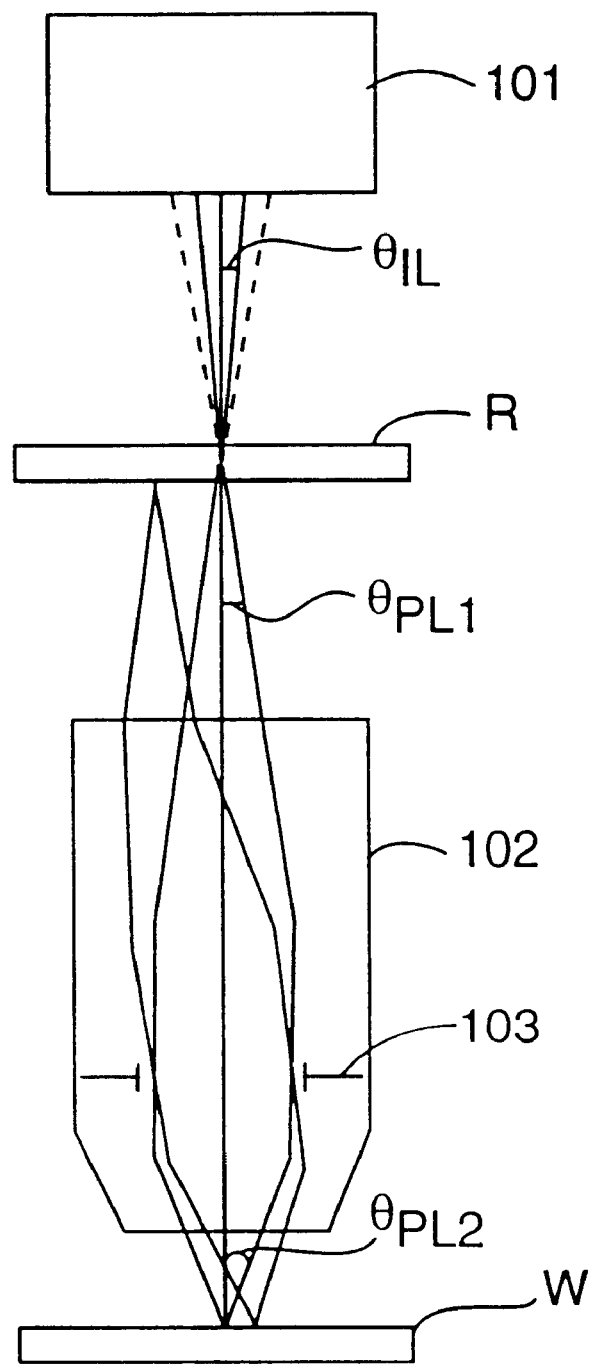
FIG. 13 is a schematic diagram depicting a conventional projection exposure device.

The variables $k_1$ and $k_2$ are process coefficients (referred to as the "k factor" hereafter), $\lambda$ is the wavelength of the projection illumination light, and NA is the numerical aperture of projection exposure system 102. As indicated in FIG. 13, if the aperture half-angle of the imaging luminous flux of the wafer side (image side) of the projection exposure system 102 is designated as $\theta_{PL2}$ and the gas around it is air, then the numerical aperture (NA) can be described by sin $\theta_{PL2}$. If the projection magnification of the projection exposure system 102 from the reticle (R) to the wafer (W) is designated as β (β is ⅕ or ¼, etc.), and the aperture half angle of the imaging luminous flux by the projection exposure system 102 on the reticle side (object side) is designated as $\theta_{PL1}$, then the following relationship exists between the aperture half angle $\theta_{PL2}$ and $\theta_{PL1}$.

$$\sin \theta_{PL1} = \beta * \sin \theta_{PL2} = \beta * NA \tag{3}$$

Only the diffracted light from reticle (R) with a diffraction angle of $\theta_{PL1}$ or less would contribute to the imaging of the projected image of the pattern of the reticle (R) as described by equation (3).

Furthermore, if the aperture half angle of the reticle (R) for exposure from the illumination optical system 101 is designated as $\theta_{IL}$, and the coherence factor, i.e. ratio of the aperture number (sin $\theta_{IL}$) of the injection side of the illumination optical system 101 against the aperture half angle (sin $\theta_{PL1}$) of the illumination angle, is designated as σ (σ value), then the aperture half angle $\theta_{IL}$ of the illumination light can be described by equation (4) as follows using, equation (3). Furthermore, the range of σ value is $0 \leq \sigma \leq 1$.

$$\sin\theta_{IL} = \sigma*\sin\theta_{PL1} = \sigma*\beta*NA \quad (4)$$

The value of the k factor $k_1$ and $k_2$, which determines the resolution R and depth of focus (D), changes depending upon the σ value which is the coherence factor. The value of k factor $k_1$ and $k_2$ also change by switching the illumination optical system 101 from the normal illumination method, where the shape of the secondary light source to the so-called modified illumination is composed of multiple light sources set concentrically from the optical-axis or annular light sources. The k factors $k_1$ and $k_2$ also change, concurrently, by the placing a designated optical filter (so called pupil filter) on the pupil plane of the projection optical system 102. Furthermore, the value of the k factors $k_1$ and $k_2$ change when the so-called phase shift reticle, which contributes designated phase differences to a periodic pattern or so-called half tone reticle, which contributes a designated transparency distribution within a period pattern, is used as the reticle (R). With the conditions described above, the k factors $k_1$ and $k_2$ change within the range given below.

$$0.45 \leq k_1 \leq 0.6,\ 0.7 \leq k_2 \leq 2.0 \quad (5)$$

Therefore by employing the various conditions described above, exposure conditions with a large depth of focus (D) and a high resolution R are used corresponding to the exposure subject device.

The depth of focus (D) is given by equation (2). However, by designating the focus control accuracy as $C_F$, which is the accuracy when the wafer is focused using the auto-focus method on a projection exposure device, and designating the step-difference of the base pattern under the photoresist on the wafer (referred to as the "mark step difference" hereafter) as $D_M$, the width $(D-C_F-D_M)$ obtained by subtracting focus control accuracy $C_F$ and mark step difference $D_M$ from depth of focus (D) gives the effective depth of focus that can be used by the operator of the projection exposure device, i.e. the usable depth of focus.

In reality, if the thickness of the photoresist (resist thickness) on the wafer is designated as $T_R$, then in order to obtain a good resist pattern after developing the photo resist, the width (necessary width of depth of focus for exposure) obtained by multiplying the resist thickness $T_R$ by a designated coefficient $K_{UD}$ less than 1, needs to be within the usable width of the depth of focus. Therefore, width $T_R*K_{UD}$, obtained by multiplying the resist thickness $T_R$ by the coefficient $K_{UD}$, is referred to as the usable depth of focus (UDOF) hereafter. Based on these factors, the focal depth (D) of equation (2) needs to be wider than the sum of focus control accuracy $C_F$, the mark step difference $D_M$, and the-usable depth of focus UDOF $(T_R*K_{UD})$. Equation (6), below is referred to as the "condition regarding the permissible range of the depth of focus".

$$C_F + D_M + T_R*K_{UD} \leq D = k_2*\lambda/NA^2 \quad (6)$$

As a general example, if the i-line (λ=365 nm) of the mercury lamp is used as an exposure illumination light, 0.55 is used as the k factor $k_1$, and the numerical aperture (NA) of the projection exposure system is designated as $NA_1$ for setting the resolution R to 0.4 μm, which projects an image of the line and space pattern (L/S pattern) of a line width of 0.4 μm corresponding to a 64 M-bit DRAM pattern projected onto the wafer, then according to equation (1) the numerical aperture $NA_1$ becomes:

$$0.4 = 0.55*0.365/NA_1 (NA_1 = 0.50) \quad (7)$$

Furthermore, when the mark step difference $D_M$ of the wafer (W) is designated as 0.8 μm, resist thickness $T_R$ as 1 μm, coefficient $K_{UD}$ which sets usable depth of focus UDOF as 0.7, k factor $k_2$ as 2.0, and numerical aperture $(NA_2)$ of the projection exposure system which satisfies the condition regarding the permissible range of the depth of focus as $NA_2$, then the numerical aperture NA becomes:

$$0.5 + 0.8 + 1*0.7 \leq 2.00*365/NA_2^2,\ (NA_2 \leq 0.60) \quad (8)$$

Equations (7) and (8) define the condition for the numerical aperture (NA) of the projection. exposure system for the manufacture of a pattern on a 64 M-bit DRAM using the i-line of a mercury lamp when $0.5 \leq NA \leq 0.6$. Also, in order to set the k factor $k_1$ and $k_2$ to the values described above, is desirable that the coherence factor a value be set to approximately $0.7 \leq \sigma \leq 0.8$. Furthermore, for periodic patterns, it is conventional knowledge that resolution can be improved without narrowing the depth of focus by employing the modified illumination method where the geometry of the secondary light source of the illumination optical system is set to be a multiple light source or an. annular light source (annular illumination method) which are offset from the optical-axis. There have been attempts at employing such a modified illumination method to increase the resolution. Note that the modified illumination method may be limited to an illumination method comprised of multiple light sources whose geometry of the secondary light source is offset from the optical-axis under a narrow definition. However, the modified illumination method will include the annular illumination method in this detailed description.

As described above, by using i-line of a mercury lamp as the illumination light for exposure and setting the numerical aperture (NA) of the projection exposure system as $0.5 \leq NA \leq 0.6$, it is possible to transfer images of patterns with a circuit pattern corresponding to a 64 M-bit DRAM, i.e. with resolution R of 0.4 μm, at a high accuracy. Furthermore, in recent years the manufacturing of a 256 M-bit DRAM, which is the next generation semiconductor device, is starting up, so that there is a need to improve the resolution to the order of 0.25 μm. In order to increase resolution R, the wavelength λ of the exposure illumination light can be shortened, or the numerical aperture (NA) for the projection exposure system can be increased.

However, if the wavelength λ is simply shortened or the numerical aperture (NA) increased, the depth of focus (D) in equation (2) becomes narrower, so that the condition regarding the permissible range of the depth of focus of equation (6) is no longer satisfied. Since the depth of focus (D) decreases in inverse proportion to the square of the numerical aperture (NA), as can be seen from equation (2), the idea of expanding the numerical aperture (NA) even further has not been considered. Therefore, in the past, KrF excimer laser light source (exposure wavelength λ=248 nm) was used as an exposure light source, gaining a resolution R of 0.25 μm, and also satisfying the condition regarding the permissible range of the depth of focus of equation (6), along with (a) introducing techniques for wafer flattening and (b) improvement in focus control techniques.

The wafer flattening technique of (a) is a technique for increasing the flatness of the wafer surface using physical or chemical means in order to decrease the curvature of the wafer or the step difference of the circuit pattern. This decreases the mark step difference $D_M$ to the order of 0.1 μm from the 0.8 μm historically. Improvement in the focus control technique of flattening technique (b) has improved focus control accuracy $C_F$ to the order of 0.4 μm from 0.5 μm historically. Estimating the numerical aperture (NA) of the projection exposure system under these exposure conditions, the numerical aperture $NA_1$ that satisfies equation (1) becomes as follows with the k factor $k_1$ set to 0.55:

$$0.25=0.55*0:248/NA_1; \ (NA_1=0.55) \qquad (9)$$

The numerical aperture $NA_2$ which satisfies the condition regarding the permissible range of the depth of focus of equation (6) is given below in equation (10). Note that k factor $k_2$ is now 1.7 since the line width has decreased, while the coefficient $K_{UD}$ which determines the usable depth of focus UDOF remains at 0.7.

$$0.4+0.1+1*0.7 \leq +1.7*0.248/NA_2^2, \ (NA_2 \leq 0.59) \qquad (10)$$

In other words, the range of the numerical aperture (NA) under this exposure condition becomes approximately $0.55 \leq NA_2 \leq 0.6$. In order to further improve resolution, without narrowing the depth of focus, parallel use of the modified illumination method or half-tone reticle is considered as well.

However, if the exposure light source is switched from a mercury lamp to a KrF excimer laser light source in order to manufacture semiconductor devices corresponding to a 256 M-bit DRAM, the projection exposure device itself becomes expensive. This is inconvenient, since the cost benefit analysis makes if difficult to justify the additional investment.

Currently there are plans for developing a device using the ArF excimer laser light source (wavelength λ of 103 nm) as the projection exposure device for forming the circuit pattern corresponding to a 1 G-bit DRAM, which is the next generation semiconductor device. There are plans for the development of devices using an exposure illumination light of shorter wavelength, such as X rays for use as the projection exposure device for forming circuit patterns corresponding to a 4 G-bit DRAM. In other words, the mainstream school of thought is to employ an exposure illumination light of a shorter wavelength to manufacture semiconductor devices of the next generation. However, if the exposure light source is switched in order to make the exposure illumination light of a shorter wavelength, the manufacturing cost of a projection exposure device increases dramatically, which is inconvenient since the cost benefit analysis worsens even further.

In response to such problems, this invention aims to provide an exposure method which increases resolution and satisfy the conditions regarding the permissible range of the depth of focus, without reducing the wavelength of the exposure illumination light. In other words, this invention provides an exposure method which is capable of forming patterns corresponding to the next generation 256 M-bit DRAM using the i-line of mercury lamps, and patterns corresponding to a 1 G-bit DRAM using the KrF excimer laser light, and patterns corresponding to a 4 G-bit DRAM using the ArF excimer laser light. Furthermore, this invention aims to provide an exposure device which can perform such an exposure method.

It is to be understood that both the foregoing detailed description and the following general description are exemplary and explanatory and are intended to provide further explanation of the invention as claimed.

The exposure device and method according to this invention relates to an exposure device and method which illuminates the transfer pattern formed upon mask (R) by illumination light (IL) for exposure from illumination optical system (1–4, 5A, 10–12), then transfer exposes the image of the pattern of mask (R) onto the photosensitive substrate (W) by the projection exposure system (PL) under the illumination light. It is configured with a normal illumination condition having light quantity distribution at the illumination system pupil plan e in the first region,(75A, 75B) which includes the optical-axis (AX) and with the modified illumination condition where the light quantity distribution is in the second region (75C, 75D) which does not include the optical-axis (AX), and it selectively switches the illumination optical system between the normal and modified illumination conditions depending upon the numerical aperture of the projection exposure system (PL).

The present invention projects the pattern of mask (R) onto the circuit board (W) coated with photosensitive material under the illumination light (IL), and controls the integrated exposure quantity of the exposure illumination light (IL) based on the thickness of the photosensitive material coated on the circuit board (W).

In order to improve, the resolution of the image to be transferred and the projection exposure system is to be used according to the present invention, the numerical aperture (NA) of the projection exposure system in equation (1) is increased rather than shortening the wavelength λ of the exposure illumination light. However, if the numerical aperture (NA) is simply increased and the depth of focus (D) is narrowed in inverse proportion to its square from equation (2), the condition regarding the permissible range of the depth of focus of equation (6) is no longer satisfied. Therefore, in order to meet the condition regarding the permissible range of the depth of focus in this invention the numerical aperture (NA) is increased in the under exposure condition where the thickness $T_R$ of the photosensitive material (photoresist) in equation (6) is thin, the usable depth of focus UDOF ($=T_R * K_{UD}$) is narrow, and the mark step difference $D_M$, which is the step difference of the foundation pattern, has been reduced using a flattening technique for the circuit board.

If the numerical aperture (NA) is increased in this manner the resolution R can be improved or refined, so that the illumination optical system can be at a normal illumination condition, i.e., the light quantity distribution at the illumination system pupil plane can be in the first region (75A, 75B) which includes the optical-axis (AX). Thus, patterns corresponding to the semiconductor devices of the next generation can be transferred with high accuracy without reducing the wavelength λ of the exposure illumination light. However, if the thickness of the photosensitive material $T_R$ is thinned, it becomes difficult to control the integrated exposure quantity with high accuracy since the necessary integrated exposure quantity for appropriately exposing the photosensitive material becomes small, and the appropriate sensitizing time becomes shorter.

For example, uneven thickness of the photosensitive material can occur due to minor temperature changes during the thin coating of the photosensitive material, or the length of the storage time of the photosensitive material. Therefore, the sensitizing time changes for each photosensitive material based only on the averaged thickness information from the coater of the photosensitive material makes it difficult to control the target value for the integrated exposure quantity of the exposure illumination light for each circuit board,. In order to respond to this, in this invention, the thickness of photosensitive material $T_R$ on the circuit board (W) is actually measured prior to exposure, and then the integrated exposure quantity is controlled based on this thickness. This allows the condition regarding the permissible range of the depth of focus to be satisfied and an appropriately integrated exposure quantity to be obtained even when the resolution is improved by enlarging the numerical aperture (NA) of the projection exposure system and the depth of focus becomes narrower.

In order to control the integrated exposure quantity the illuminance or the exposure time can be controlled by the projection exposure device of the stepper type, but for a projection exposure device of the step-and-scan method the integrated exposure quantity can be controlled not only by controlling of the illuminance, but also by controlling scanning speed of the circuit board (W) or width of the slit like illumination area.

In this case, it is desirable that the optimal integrated exposure quantity of the photosensitive material at a designated standard thickness corresponding to the mask is stored in memory beforehand and that the difference of the thickness of the photosensitive material from the designated thickness be calculated and the integrated exposure quantity of the exposure illumination light be set based on this difference. This allows the appropriate integrated exposure quantity to be obtained with a simple calculation even when the thickness of the photosensitive material changes.

When the transfer pattern on the mask is next projection exposed onto the circuit board (W) by projection exposure system (PL), and the thickness of the photosensitive material coated on the circuit board (W) is 0.5 $\mu$m or less, it is desirable to set the numerical aperture of the projection exposure system (PL) to 0.68 or greater. In the conventional exposure method if the numerical aperture is simply increased to 0.6 or greater, the condition regarding the permissible range of the depth of focus in equation (6) is no longer satisfied. However, by improvement in focus control techniques and flattening techniques, this condition of equation (6) can be satisfied with a numerical aperture of 0.68 or greater up to 0.8 when the thickness of the photosensitive material $T_R$ is 0.5 $\mu$m or less. Thus, the resolution of the pattern that can be transferred is improved to what would correspond to the next generation, and the condition regarding the permissible range of the depth of focus is satisfied as well without making the wavelength of the exposure illumination light shorter, or in other words without using an expensive exposure illumination light source.

An exposure method with the transfer pattern on the mask (R) transfer exposed onto a circuit board (R) coated with photosensitive material under illumination light (IL)for exposure, will now be described. The second exposure method according to this invention carries out control of the numerical aperture for projection exposure system (8) according to the thickness of the photosensitive material coated on the circuit board (R).

According to this embodiment of the present invention, the numerical aperture of the projection exposure system (PL) is set to 0.7 or greater when the thickness of the photosensitive material coated on the circuit board (W) is 0.2 $\mu$m or less, while the numerical aperture of the projection exposure system (PL) is set to 0.6 or less when the thickness of the photosensitive material coated on the circuit board (W) is 1.0 $\mu$m or greater. For example, if the exposure illumination light is a KrF excimer laser light (wavelength of 248 nm), a pattern corresponding a 256 M-bit DRAM (resolution of approximately 0.25 $\mu$m) can be transferred with high accuracy with the numerical aperture of 0.6 or less, and a pattern corresponding a 1 G-bit DRAM (resolution of approximately 0.18 $\mu$m) can be transferred with high accuracy with a numerical aperture of 0.7 or greater. This means that a single exposure device can transfer patterns corresponding to two generations of semiconductor devices with a high degree of accuracy.

A further embodiment of the exposure method, according to this invention, is described below referencing the figures. This embodiment is an application of this invention when exposure is carried out using a projection exposure device of the step-and-scan method.

In the under exposure condition, where the thickness $T_R$ of the photosensitive material is thick and the mark step difference $D_M$ is large, the numerical aperture (NA) is decreased in order to satisfy the condition regarding the permissible range of its depth of focus. When the numerical aperture (NA) is reduced in this manner resolution R may not be sufficient. Therefore, if resolution R needs to be improved the illumination optical system is set to the modified illumination condition in order to improve resolution R without making the depth of focus (D) shallower. In other words, the light quantity distribution is set to the second region (75C, 75D), see FIG. 7, which does not include the optical-axis (AX). In this invention, which combines the above, the resolution is improved by setting the numerical aperture (NA) to a large number while satisfying the condition regarding the permissible range of the depth of focus under various exposure conditions, while on the other hand it improves its resolution by setting its illumination optical system to an illumination which is modified when the numerical aperture (NA) can not be set to a large number. By switching the numerical aperture of the projection exposure system, patterns corresponding to two generation's worth of semiconductor devices can be transferred using a single exposure device.

Figure 1:
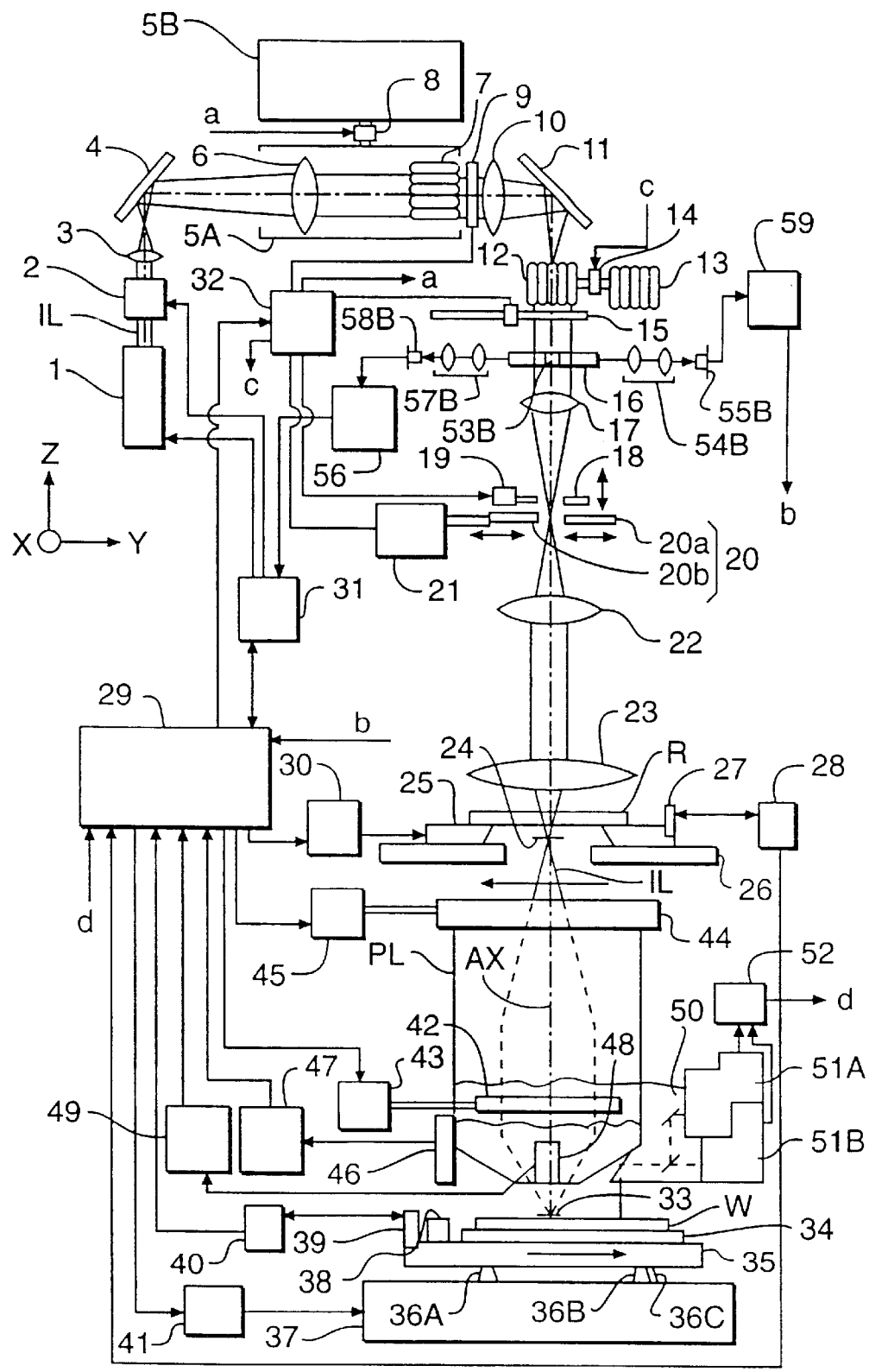
FIG. 1 is a schematic diagram depicting the projection exposure device of one embodiment of the exposure method and device according to this invention.

The exposure device according to this invention is comprised of an illumination optical system (1–4, 5A, 10–12), as show in FIG. 1, which illuminates the transfer pattern formed upon the mask using exposure illumination light and a projection exposure system (PL) which projects the image of the pattern of mask (R) onto the photosensitive substrate (W) under the illumination light. This device is equipped with a projection condition switching method (42, 43) which switches the numerical aperture of the projection exposure system (PL). A normal illumination condition occurs when the light quantity distribution at the illumination pupil plane which is an optical Fourier conversion surface for the pattern surface of the mask (R) within the illumination optical system and which includes the first region (75A, 75B) has the optical-axis (AX). A modified illumination condition occurs when light quantity distribution is in the second region (75C, 75D), which does not include the optical-axis (AX), and an illumination condition switching method (5A, 5B, 8, 12–15, 32) which switches between multiple illumination conditions. This illumination condition switching method sets the illumination optical system to the normal illumination condition. when the numerical aperture of the projection exposure system (PL) is 0.68 or greater and sets the illumination optical system to its modified illumination condition when the numerical aperture of the projection exposure system (PL) is set to 0.6 or less.

According to the exposure device of this invention, the exposure method of this invention described above, can be carried out. By flattening the circuit board the mark step difference $D_M$ can be reduced to 0.1 $\mu$m or less, while the under exposure condition with thickness $T_R$ of the photosensitive material set to 0.5 $\mu$m or less, the condition regarding the permissible range of the depth of focus in equation (6) can be satisfied when the numerical aperture (NA) of the projection exposure system (PL) is set greater than 0.68 and up to 0.8 or so. In such a region of the numerical aperture NA, since the resolution R is extremely fine, the illumination optical system can operate in the normal illumination condition. On the other hand, if the mark step difference $D_M$ is 0.8 μm or so, and the thickness $T_R$ of the photosensitive material is approximately 1 μm, there is a need to set the numerical aperture (NA) of the projection exposure system (PL) to 0.6 or greater in order to satisfy the condition regarding the permissible range of the depth of focus. If resolution R becomes too coarse during usage, the resolution can be improved by setting the illumination optical system to the modified illumination condition.

Figure 5:
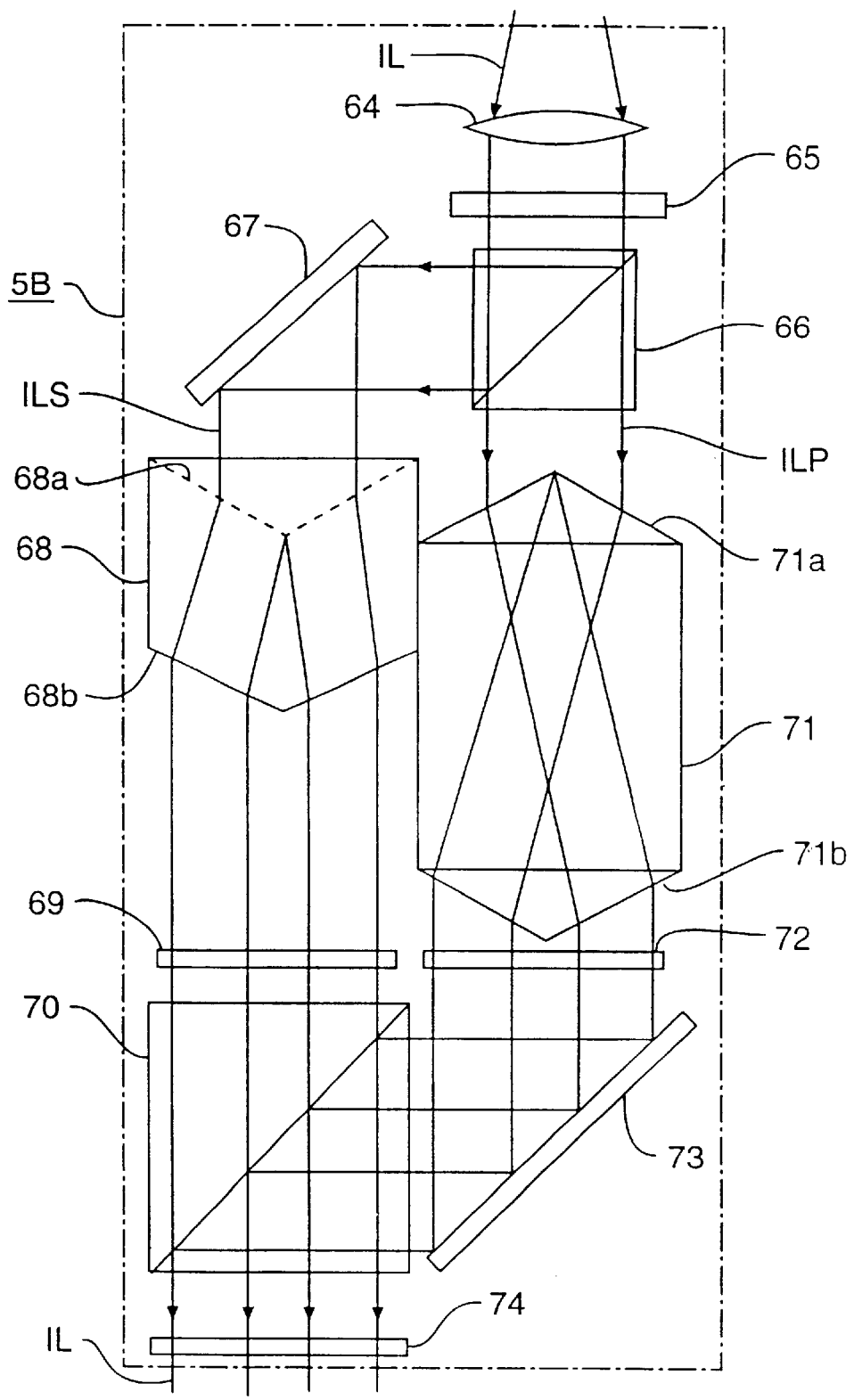
FIG. 5 is an optical path diagram depicting the composition of the input optical system 5B of FIG. 1.

An example of an illumination condition switching method is shown in FIG. 5, where the optical illumination system possesses a luminous flux splitting system (66, 67) which splits the illumination light for exposure into the first and second luminous fluxes (ILP, ILS). The first luminous flux magnification system (68) widens the cross section geometry of the first luminous flux into a ring shape. The second luminous flux magnification system (71) which widens the cross section geometry of the second luminous flux into a ring shape with the light quantity distribution reversed the in inner and outer regions. The luminous flux synthesis system (70, 73) synthesizes the luminous flux from the first and second luminous flux magnification systems (68, 71) in front of the illumination system pupil plane. It is desirable that the illumination condition switching method guides the luminous flux (IL') which was previously synthesized by the luminous flux synthesis system (70,73) and injected to the illumination system pupil plane and the carry out annular illumination during setting of the modified illumination condition.

Figure 6A:
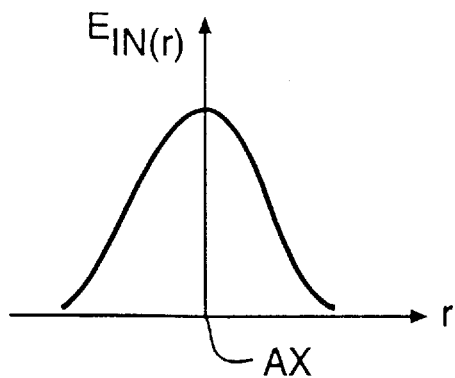
FIGS. 6(a)–6(d) depict the illuminance distribution for the illumination light at each point of the input optical system 5B of the projection exposure device.
Figure 6B:
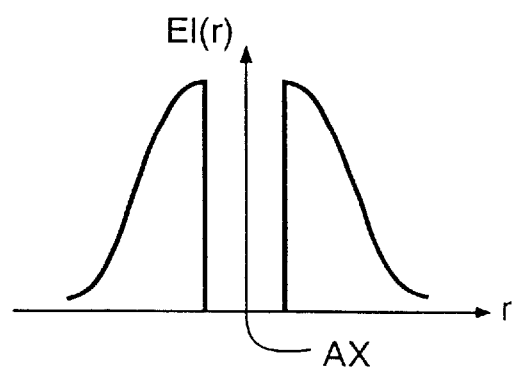

If the illuminance distribution, of the illumination light on the plane of emergence of the luminous flux splitting system (66, 67), is a monotonously decreasing distribution (Gaussian distribution for example) in the radial direction from the optical-axis, as shown in FIG. 6 (a), then the illuminance distribution of the luminous flux injected from the first luminous flux magnification system (68) becomes an annular like distribution monotonously decreasing in the radial direction, as shown in FIG. 6(b). The illuminance distribution of the luminous flux injected from second luminous flux magnification system (71) becomes an annular like monotonously increasing distribution in the radial direction, as shown in FIG. 6(c), so that illuminance distribution of the synthesized light injected from luminous flux synthesis system (70,73) becomes a flat annular. By using this synthesized light to carry out annular illumination the work efficiency of the illumination light increases and the illuminance distribution on the mask (R) also becomes uniform.

An alternate exposure method of this invention concerns an exposure method, which detects the image of the position matching mark (165) on the photosensitive substrate (W) by the alignment optical system (OBL, 162, 164) under illumination light for alignment, as shown in FIGS. 1 and 11. Position matching of the photosensitive substrate (W) is carried out based on the detection result. The image of the pattern formed on mask (R) onto the photosensitive substrate (W) by the projection exposure system (PL) under the illumination light (IL) for exposure. It is equipped with a normal detection method which uniformly (167A) transmits the imaging luminous flux on the alignment system pupil plane (HF2), which is the optical Fourier conversion surface for the surface of the photosensitive substrate (W) in the alignment optical system. The outline emphasis detection condition transmits the imaging luminous flux at a designated distribution and performs outline emphasis, and then switches its alignment optical system between two detection conditions depending upon the numerical aperture of the projection exposure system (PL).

According to this invention, the under exposure condition with a thin photosensitive material of thickness $T_R$ and a small mark step difference $D_M$ of the base feature pattern, the resolution R is increased by increasing the numerical aperture (NA) within the boundaries of the permissible range of the depth of focus. When the mark step difference $D_M$ is small, it is difficult to obtain an image with a good contrast to use as the position matching mark on the photosensitive substrate (W) by the alignment optical system under the normal detection condition. Therefore, when the mark step difference $D_M$ is small and the numerical aperture (NA) of the projection exposure system is enlarged, by setting the detection condition to the outline emphasis mode, the contrast of the image of the position matching mark is increased and the position of the position matching mark is detected with high accuracy.

Additionally, if during the under exposure condition the thickness $T_R$ of photosensitive material is thick and the mark step difference $D_M$ is large, the numerical aperture (NA) of the projection exposure system (PL) is decreased to satisfy the condition regarding the permissible range of the depth of focus, and its alignment optical system is set to the normal detection condition. The mark step difference $D_M$ produces a large position matching mark image with a good contrast and can be obtained when the system is operating at its normal illumination condition.

In the above situation it is desirable to set the alignment optical system be set to its outline emphasis detection condition when the numerical aperture of the projection exposure system is set to 0.68 or greater, the alignment optical system should be set to a normal detection condition when the numerical aperture of the projection exposure system (PL) is set to 0.6 or less. As described above, the numerical aperture (NA) of projection exposure system (PL) can be set to 0.68 or greater when the mark step difference $D_M$ is approximately 0.1 μm or less and the thickness $T_R$ of photosensitive material is approximately 1 μm, but when the mark step difference $D_M$ is high with a sufficiently good contrast, position matching the mark image with can be obtained using the normal detection condition.

Note that for the alternate method, the alignment optical system obtains an image of the position matching mark. It is possible to switch between the two types of alignment sensors, depending upon the mark step difference, by using an alignment sensor for high step difference marks, such as the imaging method (FIA method) used in the normal detection condition, and the two luminous flux interference method (LIA method), which illuminates two luminous fluxes onto the diffraction lattice-like position matching marks and detects the phase of interference light composed of diffracted light generated in the same direction from the mark.

The invention also switches the condition of the illumination optical system for exposure or for alignment depending upon the numerical aperture (NA) of the projection exposure system (PL). This numerical aperture (NA) of the projection exposure system is set to a large value when the thickness $T_R$ of the photosensitive material is thin and is set to a small value when the thickness $T_R$ of the photosensitive material is thick. Therefore, the illumination optical system for exposure can be set so as to use either the normal or modified illumination condition. Depending upon the thickness of the photosensitive material the alignment optical system can be set to either the normal or outline emphasis detection method. Furthermore, the alignment optical system can switch between the alignment sensor for the high step difference mark or the alignment sensor for the low step difference mark depending upon the thickness of the photosensitive material.

An embodiment of the exposure method and device according to this invention is now described, with reference to the figures. This embodiment is an application of the invention when exposure is carried out using the projection exposure device of the step-and-scan method.

FIG. 1 is a schematic diagram of the projection exposure device of this embodiment. In FIG. 1, the illumination light (IL) composed of a 248 nm wavelength laser beam pulse emitted from KrF excimer laser light source 1, as the exposure light source, is attenuated at a designated attenuation rate in the beam attenuation unit 2, and then is incident on first flyeye lens 7 by beam expander composed of first lens 3, polarization mirror 4, and second lens 6. The input optical system 5A is composed of second lens 6 and flyeye lens 7, and this input optical system 5A is constructed to be interchangeable by exchange unit 8 with the annular illumination input optical system 5B to be described below.

The illumination light (IL) whose illuminance distribution is made uniform by the first flyeye lens 7 is incident on the plane of entrance of the flyeye lens 12 of stage two for normal illumination use by illuminance distribution correction board 9 (composed of parallel flat glass for correcting the uneven illuminance distribution due to direction of illumination light), relay lens 10, and polarization mirror 11. The plane of entrance of the first flyeye lens 7 is conjugated with the plane of entrance of the second flyeye lens 12, and the enlarged image of each lens element comprising the flyeye lens 7 of the former is superimposed on the plane of exit of the flyeye lens 12. Also, the flyeye lens 12 is constructed so as to be interchangeable with flyeye lens 13 for annular illumination to be described later, by exchange mechanism 14. In the following description, the optical-axis of illumination optical system beyond second flyeye lens 12 and the projection exposure system (PL) is designated as optical-axis (AX), the Z-axis is taken to be parallel to the optical-axis (AX), the Y-axis is normal to the paper surface and normal to the Z-axis, and the X-axis is taken so as to be normal to the paper surface.

At this time, the plane of exit of the second flyeye lens 12 becomes an optical Fourier conversion surface (pupil plane) for the pattern formation surface of the reticle (R), and σ diaphragm unit 15 composed of a multiple illumination system diaphragm (referred to as σ diaphragms hereafter) is located on the plane of exit of flyeye lens 12.

Figure 7A:
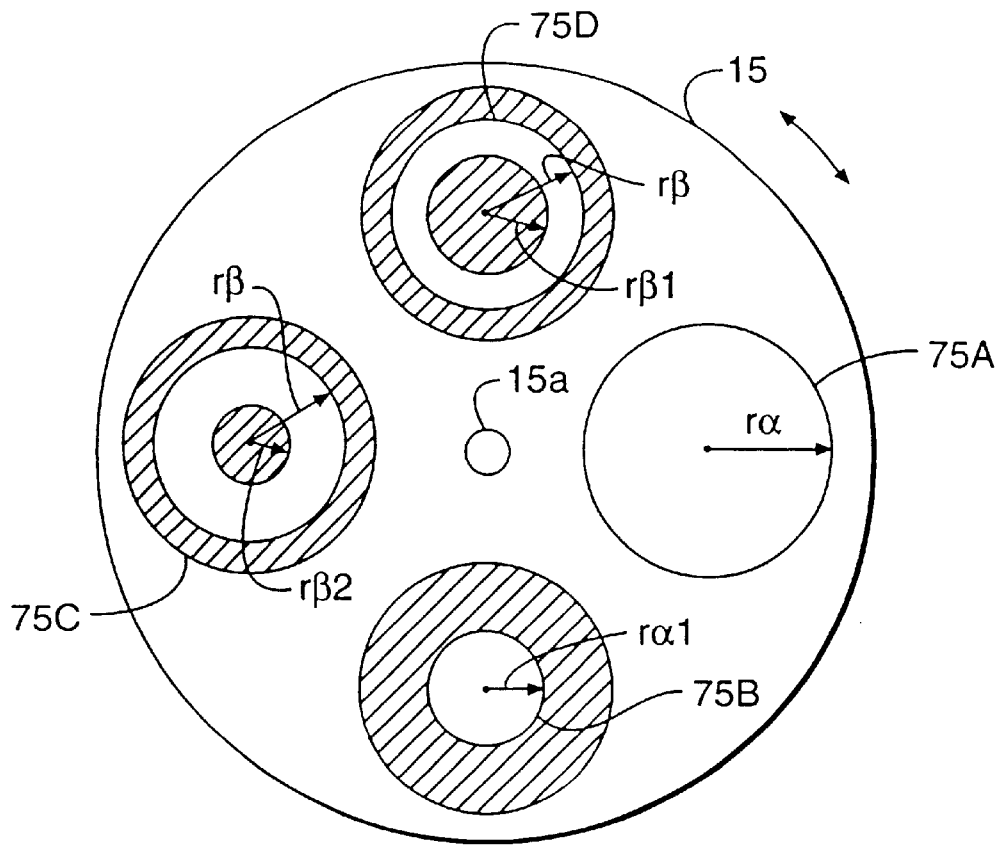
FIG. 7(a) depicts the composition of σ diaphragm unit 15 of the projection exposure device.

FIG. 7(a) indicates the σ diaphragm unit 15 composed of rotatable disks, around driving axis 15a, are formed at equal distance, σ diaphragm 75A for large σ values, σ diaphragm 75B for small σ values, σ diaphragm 75C for first annular illumination, and σ diaphragm 75D for second annular illumination. Details on the geometry of σ diaphragms 75A–75D will be provided later.

Returning to FIG. 1, corresponding to the direction from the main control unit 29, which centrally controls the action of the whole device, to the illumination control system 32 regarding the exposure conditions, the illumination control system 32 rotates the σ diaphragm unit 15 and sets the designated σ diaphragm on the plane of exit of flyeye lens 12. At the same time, the illumination control system 32 exchanges the two input optical system 5A and 5B by exchange device 8, while also exchanging the two flyeye lens 12 and 13 by exchange device 14.

The illumination light (IL), emerging from flyeye lens 12 and transmitted through the designated σ diaphragm of σ diaphragm unit 15, after passing through split prism plate 16 and first relay lens 17, then fixed field diaphragm (fixed reticle blind) 18 which is driven in the Z-tilt direction sequentially, is incident on the movable field finder diaphragm 20 which is driven in the XY-direction. In this embodiment, the movable field diaphragm 20 is located on the conjugated surface of the pattern formation surface of the reticle (R), and the fixed field diaphragm 18 is placed on a slightly defocused plane from that conjugated surface. Also, a rectangular fixed aperture for defining the slit-like illumination region of the reticle (R) is formed on the fixed field diaphragm 18. Furthermore, the position in the Z-direction and the tilt angle of the fixed field diaphragm 18 are composed in such a manner as to be finely controllable by means of the illumination control system 32 by drive device 19.

On the other hand, the movable field diaphragm 20 is comprised of a pair of movable blades 20a and 20b, which can move independently in the Y-direction, and a pair of movable blades (not shown) which can move independently in the X-direction. The motion of movable blades 20a or 20b is controlled by the illumination control system by drive unit 21. When scanning exposure is to be carried out for each shot region on the wafer (W), there are cases where the illumination light (IL) illuminates a region other than the reticle (R) pattern region right after the start of scan exposure and just prior to finishing. Therefore, the movable field diaphragm has an added role of restricting the illumination region on the reticle (R) as defined by fixed field diaphragm 18 just after starting and just prior to finishing the scan exposure.

The illumination light (IL) which was transmitted through the fixed field diaphragm 18 and the movable field diaphragm 20 illuminates a slit-like illumination region 24 of the pattern formation surface of the reticle (R), at a uniform illuminance distribution by the second relay lens 22 and condenser lens 23. The illumination region 24 of this embodiment is a rectangular region with the long edge in the X-direction, and the scanning direction of reticle (R) is in the Y-direction, which is the direction parallel to the paper surface. Under this illumination light (IL), the pattern within the illumination region 24 on reticle (R) is shrunk to the projection magnification β (β is ¼, 1/5, etc.) by the projection exposure system (PL), and is image projected onto the slit-like exposure region 33 on the surface of wafer (W) coated with photoresist. On the pupil plane of the projection exposure system (PL) (optical Fourier conversion surface for pattern formation surface of reticle (R)), is a changeable aperture diaphragm 42 with an iris like diaphragm, and by changing the aperture diameter of changeable aperture diaphragm 42 by means of the main control unit 29 by drive unit 43, the numerical aperture (NA) of the projection exposure system (PL) can be switched between 0.5–0.8.

Reticle (R) is suspended-above reticle stage 25 by vacuum suction, and reticle stage 25 can move above the reticle base 26 suspended on column (not shown) in the Y-direction at a uniform speed and is composed so as to be slightly movable in the X, Y and rotational direction. Movable mirror 27 is fixed on the end section of the reticle stage 25, and the X-coordinate, Y-coordinate, and the rotational angle of reticle stage 25 is constantly measured by means of the laser interferometer 28 placed so as to be facing it. The measurement results are supplied to the main control unit 29 and the main control unit 29 controls the motion of reticle stage 25 by the reticle stage drive system 30 based on the measurement results.

Conversely, wafer (W) is suspended above the Z-tilt θ stage 35 by wafer holder 34 which employs vacuum suction, and the Z-tilt θ stage 35 is mounted upon XY stage 37 by three supports 36A–36C which can protrude and retract in the Z-direction. By protruding and retracting the three supports 36A–36C in parallel by the drive section within the XY stage 37, the Z-tilt θ stage 35 can be moved in the Z-direction, and by moving the three supports 36A–36C independently the tilt angle around the X-axis and around the Y-axis can be controlled. The Z-tilt θ stage 35 is also constructed so that it can be rotated around the Z-axis within designated limits. Additionally, the XY stage 37 is composed so that it can move the Z-tilt θ stage 35 in the Y-direction at a constant speed or with a stepping movement, and is also capable of step movement in the X-direction. The wafer stage is comprised of wafer holder 34, Z-tilt θ stage 35, support points 36A–36C, and XY stage 37.

The movable mirror 39 is also fixed on the end section of the Z-tilt θ stage 35 and the X coordinate, Y coordinate, and rotational angle of the Z-tilt θ stage 35 (wafer W) are constantly measured by a laser interferometer 40 disposed facing the movable mirror 3. The measurement results are supplied to the main control unit 29 which controls the motion of the XY stage 37 and Z-tilt θ stage 35 by the wafer stage control system 41 based on the supplied measurement values.

Furthermore, σ diagonal injection type multi point focus position detection system 48 for autofocus and auto-leveling is placed on the side surface of the projection exposure system (PL). In this embodiment, since the thickness of the photoresist coated on the wafer (W) is thinner than conventional, as described hereafter, a focus control accuracy which is higher than conventional is required. Therefore, as disclosed in Japanese Patent Appl. Pub. Number H6-283404 (U.S. Pat. NO. 5,448,332, the focus position (position in Z-direction) of the multiple measurement point on the surface of wafer (W) is measured in this embodiment using a method that also employs a read-ahead method. In other words, the focus position detection system 48 of this embodiment is comprised of an illumination optical system which projects a slit image to multiple (e.g. 10 or so) measurement points within the slit-like exposure region 33 on wafer (W) and the read-ahead region which precedes the exposure region 33. A light gathering optical system reimages the slit images by receiving the reflected light from the slit images and generates multiple focus signals corresponding to the side deviation value of the reimaged slit images. Multiple focus signals are supplied to the focus signal processing system 49.

In the focus signal processing system 49, the focus position $Z_1$ on the averaged surface of the exposure region 33 of the wafer (W) surface, and the tilt angle $\theta_{Y1}$ around the Y-axis are calculated from the multiple focus signals, while similarly calculating the focus position $Z_2$ of the averaged surface in the read-ahead region for the exposure region 33 and the tilt angle $\theta_{Y2}$ around the Y-axis. The calculated results are provided to the main control unit 29. In the main control unit 29 the focus position $Z_3$ of the control object is calculated from the weighted averaged of focus positions $Z_1$ and $Z_2$ for the exposure region 33 and the read-ahead region, taking into account the scanning speed of the wafer (W), the response speed of the auto focus, and the auto leveling mechanism. Furthermore, in the main control unit 29, the tilt angle $\theta_{Y3}$ of the control subject around the Y-axis is calculated from the weighted average of the tilt angle $\theta_{Y1}$ and $\theta_{Y2}$ for the exposure region 33 and the read-ahead region. At the same time, the tilt angle $\theta_{X3}$ of the control subject around the X-axis is calculated from the differentiation of the tilt angle $\theta_{X1}$ and $\theta_{X2}$ for the exposure region 33 and the read-ahead region. Autofocus and autoleveling control is carried out based on the focus position $Z_3$, the tilt angle $\theta_{Y3}$, and $\theta_{X3}$ of the control subject.

During scanning exposure, the main control unit 29 starts pulse emission of the KrF excimer laser light source by the exposure quantity control unit 31, and scans the XY stage 37 on the wafer, side in the +Y-direction (or −Y-direction) at the speed β* VR (β is the projection magnification) while synchronizing with the scanning of the reticle stage 25 in the −Y-direction (or +Y-direction) at constant speed VR, based on the measurement values from the laser interferometer 28 and 40. Furthermore, in the main control unit 29, the focus position $Z_3$, tilt angle $\theta_{Y3}$ and $\theta^{X3}$ of the control subject are sequentially calculated at designated periods based on the multiple focus signal corresponding to the exposure region 33 and the read-ahead region provided from the focus signal processing system 49. The focal position of wafer (W) is controlled by the autofocus method so that its focus position $Z_3$ converges with the focus position that gives the best imaging surface for the projection exposure system (PL), and the tilt angle of wafer (W) is controlled by the autoleveling method so that the tilt angles $\theta_{Y3}$ and $\theta_{X3}$ converge to the tilt angle that gives the best inclination angle for the best imaging surface of exposure area 33, by driving the support points 36A–36C by the wafer stage drive system 41. Thus, the image of the pattern of the reticle (R) is sequentially transferred to the transfer object shot area of wafer (W) at high resolution. The exposure method which drives the reticle stage 25 and XY stage 37 on the wafer side in sync with the pulse emission of the KrF excimer laser light source 1 is disclosed for example, in Japanese Patent Appl. Pub. H6-132191 (U.S. Pat. No. 5,591,958).

Also, since this embodiment is a step-and-scan method, the width in the scanning direction of the exposure area 33 on the wafer is narrower than for the collective exposure method and focusing is conducted continuously during scan exposure. Therefore, even if the surface of wafer (W) has a slight waviness in the scanning direction the exposure area 33 on the wafer can be matched to the best imaging surface at all times, and the averaged deviation of the focus position at exposure for each point in the shot area on the transfer object wafer (W), i.e. the focus control accuracy, is higher compared with the collective exposure method (step and repeat method) such as a stepper. However, if it is known beforehand that the waviness of wafer (W) is small, sufficiently high focus control accuracy can be obtained for the projection exposure device using the collective exposure method.

The exposure light quantity control method for the projection exposure device of this embodiment will be now be described. First, the illumination quantity monitor 38 is placed near the wafer hold 34 on the Z-tilt θ stage 35, which is composed of photoelectric elements placed so that the reception surface is at the same height as the surface of wafer W. When the illuminance of the illumination light (IL) on the surface of wafer (W) is directly measured, the reception surface of illuminance monitor 38 is placed within exposure area 33 and the detected signal of the illuminance monitor 38 is provided to the exposure light quantity control system 31, which controls the integrated exposure quantity (exposure-dose) for each shot area on wafer W. However, when the exposure is actually being carried out to the wafer (W), since the exposure light quantity cannot be directly measured on wafer (W), the exposure light quantity on wafer (W) is indirectly measured by splitting and detecting the light quantity of a portion of the illumination light (IL) which is transmitted through σ diaphragm of σ diaphragm unit 15 of FIG. 1. Therefore, a splitting prism plate 16 is placed between σ diaphragm unit 15 and first relay lens 17 in FIG. 1. In other words, the splitting prism plate 16 is placed near the pupil plane of the illumination optical system.

Figure 2A:
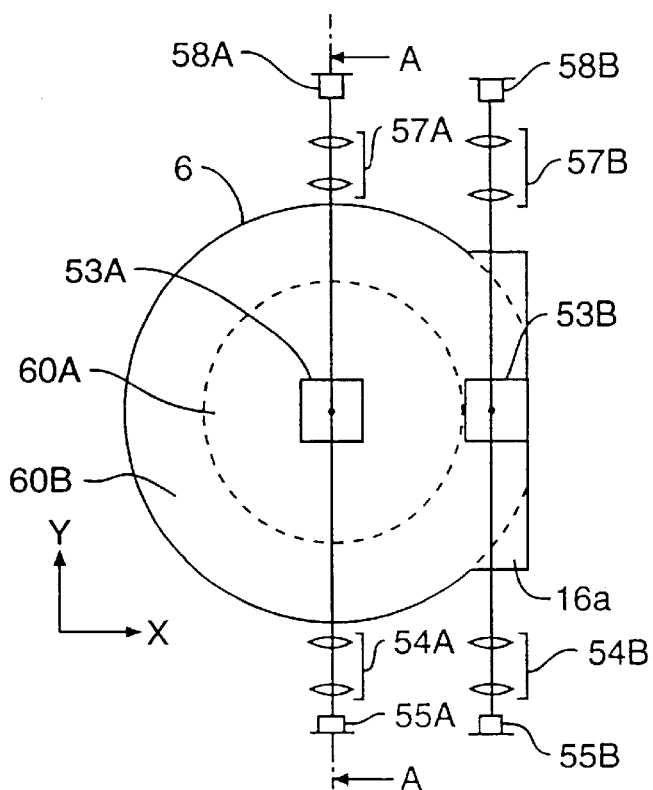
FIG. 2(a) is a planar view depicting the composition of a splitting prism plate and the detection system of the projection exposure device.
Figure 2B:
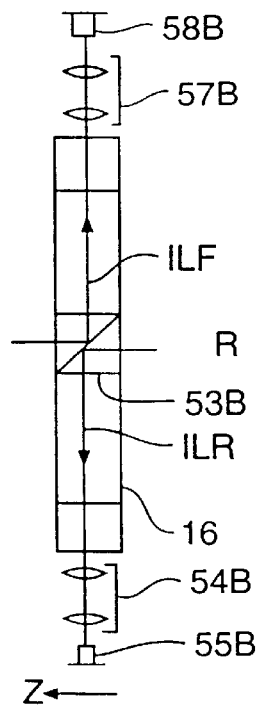
FIG. 2(b) is a right side view depicting the composition of the splitting prism plate and the detection system of the projection exposure device.
Figure 2C:
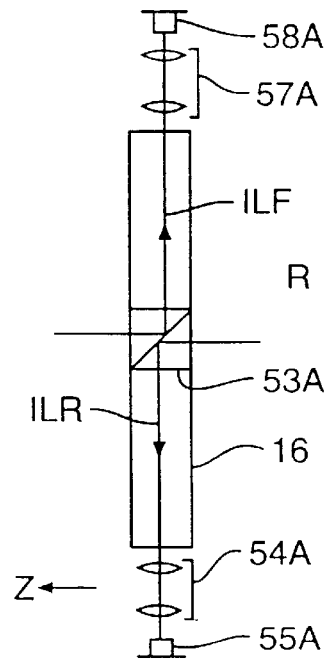
FIG. 2(c) is a cross sectional view along line AA of FIG. 2(a)

FIG. 2(*a*) is a plane view looking at the splitting prism plate 16 from the side of flyeye lens 12, FIG. 2(*b*) is right side view of FIG. 2(*a*), and FIG. 2(*c*) is a cross sectional view along line AA when the splitting prism plate 16 is divided into the left and right in FIG. 2(*a*). As indicated in FIG. 2(*a*), the splitting prism plate 16 is composed of a glass plate of a designated thickness which transmits the illumination light (IL), and prism type beam splitter 53A and 53B are embedded in its center and right end section for extracting a portion of the illumination light (IL). The transmission rate and reflection rate of beam splitter 53A, 53B for illumination light (IL) are approximately 95% and 5%, respectively.

As indicated in FIG. 2(*b*), of the illumination light injected at splitting prism plate 16 from the flyeye lens 12 side, the illumination light ILF reflected by beam splitter 53B is incident on the integrator sensor 58B by relay lens system 57B, and then the output signal of integrator sensor 58B is supplied to the integration exposure quantity calculator section 56 of FIG. 1. Also, of the illumination light (IL) for exposure use illuminated upon wafer (W) by the projection exposure system (PL) in FIG. 1, the reflection light reflected by wafer (W) returns to beam splitter 53B of FIG. 2(*b*), by the projection exposure system (PL) and the reticle (R), the reflection light ILR reflected by beam splitter 53B is incident on the reflection rate monitor 55B composed of photoelectric elements by the relay lens system 54B, and the output signal of the reflection rate monitor 55B is supplied to the imaging characteristics variation calculator section 59 in FIG. 1. The reflection rate for illumination light (IL) on wafer (W) can be calculated by the imaging characteristics variation calculation section 59 from the output signal of the reflection rate monitor 55B. As indicated in FIG. 2(*a*), the section 16*a* between the beam splitter 53B and the relay lens system 57B, 54B has a rectangular plate shape at the end section of disk shaped splitting prism plate 16, and the luminous flux reflected by beam splitter 53B is guided efficiently to the relay lens system 57B, 54B.

Similarly, as indicated in FIG. 2(*c*), of the light incident on the center section of splitting prism plate 16 from the flyeye lens side 12, the illumination light (ILF) reflected by beam splitter 53A is incident on integrator sensor 58A by relay lens system 57A. Also, the reflected light from wafer (W) of FIG. 1 returns to beam splitter 53A of FIG. 2(*c*) by the projection exposure system (PL) and reticle (R), and the reflection light (ILR) reflected by beam splitter 53A is incident on reflection rate monitor 55A by the relay lens system 54A. Then, the output signals of integrator sensor 58A and reflection rate monitor 55A are supplied to integration exposure quantity calculation section 56 and imaging characteristics variation calculation section 59 respectively. Note that splitting prism plate 16 in FIG. 1 is shown in a side view diagram, so that only the relay lens system 54B, 57B, integrator sensor 58B, and the reflection rate monitor 55B are shown.

In this embodiment, beam splitter 53A and 53B are placed in the center section and end section of splitting prism plate 16. Therefore, when illumination with a small coherence factor (σ value) is carried out using illumination light transmitted through center region 60, it uses the reflection light from the beam splitter 53A of the center section, while the reflection light from beam splitter 53B on the end section is used when annular illumination is carried out using the illumination light transmitted through the surrounding annular like region 60B. By switching between the two beam splitters placed in two locations measurement of the illumination light can be carried out accurately for an illumination method with a small σ value or the annular illumination method. Furthermore, when modified illumination is carried out using the σ diaphragm composed of four apertures offset from the optical-axis, another beam splitter can be placed in the light path of the illumination light from one of the four apertures, and the relay lens system and photoelectric elements placed so as to receive the luminous flux reflected by this beam splitter. Thus, the illumination light from flyeye lens 12 or 13 and reflected light from wafer can be detected with certainty at all illumination light conditions.

Returning to FIG. 1, the splitting prism plate 16 is constructed to be extremely thin since it has beam splitters 53A, 53B placed on its section. Conventionally, one large beam splitter was placed at a tilt angle of approximately 45 degrees from the optical-axis right behind the σ diaphragm, and the reflected light from the beam splitter was detected, which required a large amount of space. According to this embodiment, since only a thin splitter prism plate needs to be utilized, the illumination optical system can be reduced in size, and the design of illumination optical system is simplified.

In this embodiment, by comparing beforehand the output signal of the illuminance quantity monitor 38 and the output signal from integrator sensors 58A, 58B, the transfer coefficient for obtaining the exposure amount on the wafer (W) can be obtained from the output signal of the integrator sensor 58A, 58B, and this transfer coefficient is stored in memory within the exposure quantity control system 31. Then, when the pulse emission of illumination light (IL) is started during the scanning exposure, the integration exposure quantity calculation section 56 sequentially supplies to the exposure quantity control system 31 the integrated signal obtained by integrating N pulse number of the output signal from integrator sensor 58B (or 58A), where N is the exposure pulse number to each point on wafer W. In the exposure quantity control system 31, the integrated exposure quantity is obtained for each point on wafer (W) by multiplying the integration signal by the transfer coefficient described above, and the exposure quantity is controlled so that this integrated exposure quantity converges to the target value.

In this embodiment, there are situations where the photoresist layer on wafer (W) is thin. When the resist layer is thin the target value for its integrated exposure quantity decreases from the conventional example. With the scanning exposure method, when the target value of the integrated exposure quantity is low, the exposure time for each point on wafer (W) is shortened by first increasing the scanning speed of the stage system. However, since there is an upper limit to the scanning speed of the stage system there is a need to lower the illuminance of the illumination light (IL) when the scanning speed reaches its upper limit. In order to decrease the illuminance in such a manner, the exposure quantity control system 31 carries out control of the beam attenuation rate in the beam attenuation unit 2 in FIG. 1. Also, there are situations where the control beam attenuation rate in the beam attenuation unit 2 is carried in order to set the exposure pulse number for each point on wafer (W) to a designated value, or to respond to the output fluctuation of the KrF excimer laser light source 1 which exposes each shot area on the wafer.

Figure 3:
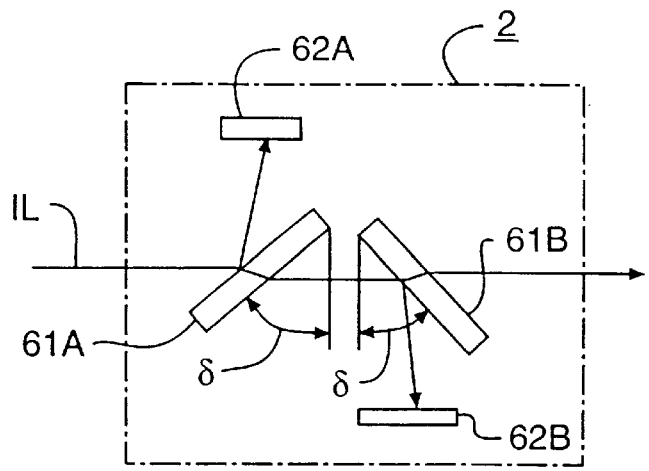
FIG. 3 is schematic diagram depicting the construction of the beam attenuation unit 2 of FIG. 1.

FIG. 3 shows a schematic of composition of the beam attenuation unit 2 of this embodiment, where two glass plates 61A and 61B are placed symmetric to the light path of the illumination light (IL) and at an inclination angle of δ, and where the shutter plates 62A and 62B are placed so as to shut out the reflected light from glass plates 61A and 61B, respectively. The inclination angle δ of glass plates 61A and 61B can be changed by a drive mechanism (not shown) while maintaining its symmetry. In this case, by making use of the fact that the transmission rate (1-beam attenuation rate) changes when the inclination angle δ changes, the desired beam attenuation rate for illumination light (IL) is obtained by controlling its inclination angle. Since two glass plates-61A and 61B are inclined symmetrically, the optical path of the illumination light (IL) does not have horizontal shifts, so no adjustments are needed for other optical systems when the beam attenuation rate (IL) is switched. Furthermore, shutter plate 62A and 62B prevents reflected light from glass plates 61A and 61B leaking outside the shutter unit 2.

In beam attenuation unit 2, in FIG. 3, the beam attenuation rate for illumination light (IL) can be continuously switched within a designated range, but if it is desired to roughly switch the beam attenuation rate for illumination light in multiple steps, an energy incremental control unit, composed of multiple ND filters with different transmission rates placed on a disk in front and back of beam attenuation unit 2, can be utilized. In this case, by rotating the disk the beam attenuation rate for the illumination light (IL) can be switched in rough increments and by combining this energy rough control unit with beam attenuation unit 2 in FIG. 3 the beam attenuation rate for illumination light (IL) can be switched continuously over a wide range.

The correction mechanism for imaging characteristic of the projection exposure system (PL) will now be described, which is placed in the projection exposure device of this embodiment. In other words, by illumination of the pulse emitted illumination light (IL), the projection exposure system (PL) is gradually heated and the projection exposure system (PL) is further heated by a luminous flux from the returning light from wafer (W) which is transmitted through the projection exposure system (PL) so that the imaging characteristics, such as the projection magnification β or the position of best imaging surface, changes. The imaging characteristics of the projection exposure system also change due to atmospheric pressure or environmental temperature. In order to correct for such changes in imaging characteristics, this embodiment supplies information, such as illuminance of illumination light (IL) and cumulative exposure time to imaging characteristics variation calculation section 59 in FIG. 1 from main control unit 29. Furthermore, as described referencing FIG. 2, output signals from the reflection rate monitors 55B and 55A, which are the signals that photoelectrically transforms reflection light from wafer (W), are supplied to the imaging characteristics variation calculation section 59. Measurement values from the atmospheric pressure and temperature sensor (not shown) are also supplied to the imaging characteristics variation calculation section 59.

The imaging characteristics variation calculation section 59 predicts the integrated value of the output signal of reflection monitor 55B, 55A, as well as the variation of the projection magnification β of the projection exposure system (PL) based on other information, such as variation in imaging surface curvature, focus position of best imaging surface, and variation of its inclination angle, and informs main control unit 29 of the prediction results. The projection optical system (PL) is equipped with lens drive mechanism 44 which drives part of its lens element in the optical-axis (AX) direction as well as tilting it in the plane normal to its optical-axis (AX) and is composed so that the main control unit 29 can control the motion of the lens drive mechanism 44 by lens drive control system 45.

When the prediction value of the variation of the imaging characteristics is supplied to the main control unit 29 from the imaging characteristics variation calculation section 59, the main control unit 29 drives a part of the lens element of the projection exposure system (PL) by lens drive mechanism 44 to compensate for the variation of projection magnification β and variation in imaging surface curvature. Furthermore, in order to match the focus position and tilt angle of the best imaging surface the main control unit 29 corrects the height and tilt angle of Z-tilt θ stage 35 (wafer W) by driving the support points 36A–36C by wafer stage drive system 41. Thus, a condition is maintained where the surface of wafer (W) matches the best imaging surface of the projection exposure system (PL) even when the imaging characteristics of the projection exposure system (PL) have changed.

The illumination optical system of this embodiment will now be described. The illumination optical system is constructed so as to be switchable between the normal illumination method where the aperture of σ diaphragm is circular and the annular illumination method which is an example of the modified illumination method. Therefore, the normal flyeye lens 12 and the flyeye lens 13 for annular illumination are installed interchangeably as the flyeye lens of the second stage in FIG. 1. This flyeye lens 13 for annular illumination is employed when the numerical aperture (NA) of the projection exposure system (PL) is, set to 0.6 or less, and annular illumination is to be carried out.

Figure 4A:
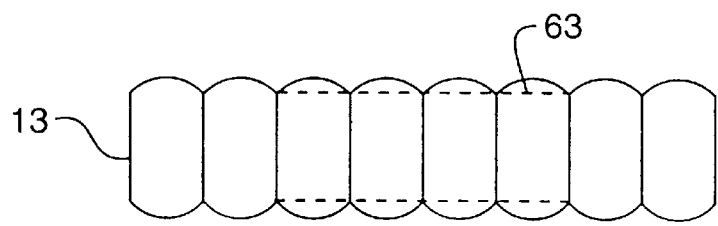
FIG. 4(a) is a side view depicting a flyeye lens 13 of FIG. 1 for the annular illumination.
Figure 4B:
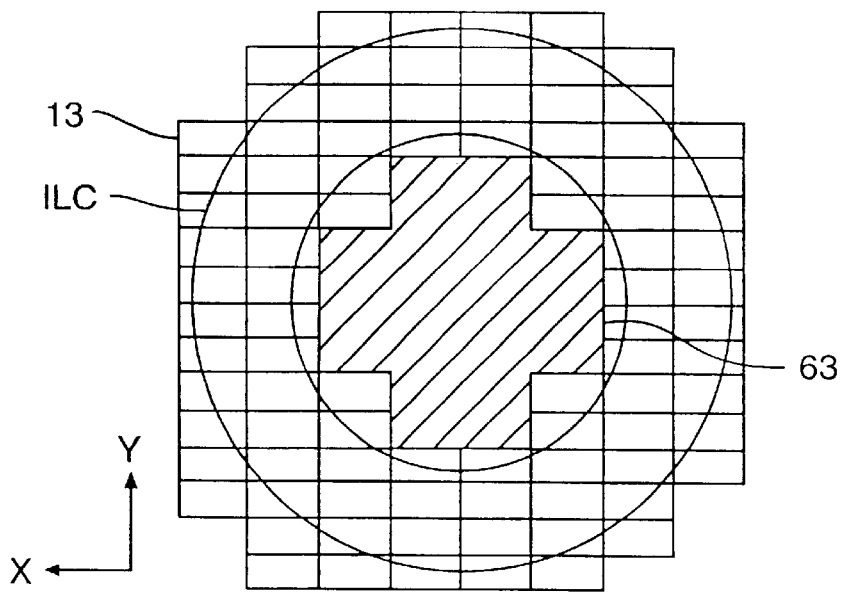
FIG. 4(b) is a planar view depicting a flyeye lens 13.

FIG. 4(*a*) is a side-view of the flyeye lens 13 for annular illumination and FIG. 4(*b*) is a planar view of the flyeye lens 13. As shown in FIG. 4(*b*), the flyeye lens 13 is constructed by bundling lens elements with rectangular cross section around the metal part 63 with the cross shaped cross section. In this case, the annular σ diaphragm 75C or 75D from σ diaphragm unit 15 in FIG. 7(*a*) is placed on the plane of exit of flyeye lens 13. If the annular luminous flux possessing the maximum cross section being transmitted through lens element section of flyeye lens 13 in FIG. 4 (*b*) is designated as (ILC), then the aperture of these σ diaphragm 75C and 75D are composed so as to fit within the luminous flux (ILC). Therefore, the manufacturing costs can be reduced by using a metal part for the cross section part of the flyeye lens 13, reducing the number of lens elements, and at the same time having the benefit of being able to illuminate the whole surface of the σ diaphragm 75C, 75D.

When the flyeye lens 13 for annular illumination is used in such a manner, the illumination efficiency is better if the distribution of the illumination light (IL) on the plane of exit of the flyeye lens 13 is annular. Therefore, when the flyeye lens 13 for annular illumination is used the illumination system control system 32 places input optical system 5B for annular illumination between the polarization mirror 4 and the illuminance distribution correction plate 9, by the exchange device 8.

FIG. 5 indicates the input optical system 5B, and in this FIG. 5, the illumination light (IL) from the polarization mirror 4 of FIG. 1 is assumed to be a linearly polarized light. After becoming an almost parallel luminous flux by lens 64, this illumination light (IL) is converted to a circular polarized light by ¼ wavelength plate 6 and is incident on polarization light beam splitter 66. It is then split into a P polarization component (ILP) and S polarization component (ILS) by polarization light beam splitter 66. In FIG. 1, ¼ wavelength plate (not shown) is also placed within input optical system 5A and the illumination light (IL) that incident on flyeye lens 7 is also converted to a circular polarized light.

FIGS. 6(a)–(d) show the illuminance distribution at the cross section of illumination light at each section of FIG. 5, where the horizontal axis in FIGS. 6(a)–(d) shows the location (r) in the direction normal to its optical-axis (AX) using the optical-axis (AX) of the illumination system as the origin, while the vertical axis indicates the illuminance at the position (r). First, the illuminance distribution $E_{IN}$ (r) of illumination light (IL), which is incident on polarization beam splitter 66 of FIG. 5 is a normal distribution with optical-axis (AX) as its centerline as indicated in FIG. 6(a). This illuminance distribution $E_{IN}$ (r) is also the illuminance distribution of the P polarization component (ILP) and S polarization component (ILS) right after taking away the designated ratio coefficient and being split by the polarization light beam splitter 66.

Figure 6C:
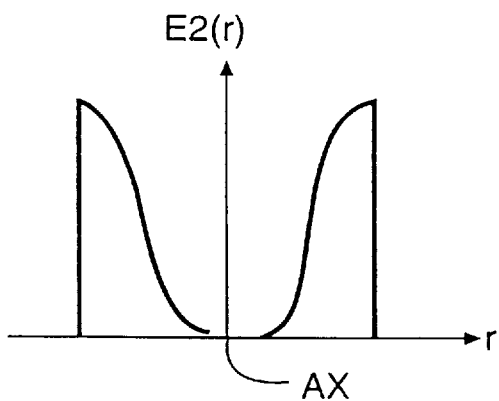

In FIG. 5, the P-polarized light component (ILP) which is transmitted through the polarization light beam splitter 66, is transmitted through optical part 71, which has a cylinder geometry with top and bottom section 71A, 71B machined to a cone shape. The illuminance distribution of P-polarized light component (ILP) is split at its center by this optical part 71, and since the inside and outside flips to become parallel light again, the illuminance distribution E2 (r) of the P-polarized light component (ILP) after injection from optical part 71 takes a distribution where the distribution indicated in FIG. 6(a) is flipped against the optical-axis (AX) and is spread out, as indicated in FIG. 6(c).

On the other hand, the S-polarized light component (ILS) reflected by polarization light beam splitter 66, in FIG. 5, is reflected by mirror 67 and is transmitted through optical part 68 which has a cylindrical part with its top part 68a cut off conically and its bottom part machined in a conical shape. Since the illuminance distribution of S-polarized light component (ILS) is split at its center and becomes parallel light once again, the illuminance distribution $E_1$ (r) of the S-polarized light component (ILS) right after injection from optical part 71 takes a distribution where the distribution indicated in FIG. 6(a) is flipped against optical-axis (AX) and spread out, as indicated in FIG. 6(b).

Figure 6D:
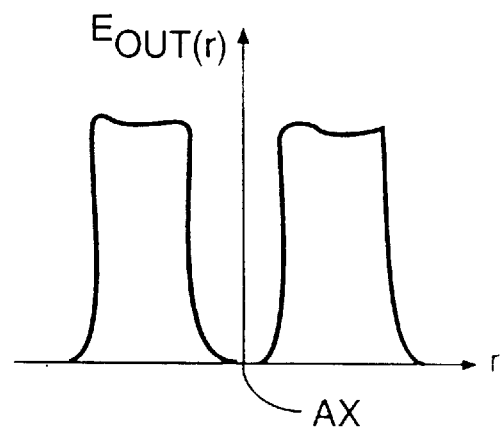

After the P-polarized light component (ILP) injected from optical part 71 is converted to S-polarized light by the ½ wavelength plate 72, it is reflected by mirror 73 then incident on polarization light beam splitter 70 and then reflected. Conversely, the S-polarized component (ILS) injected from optical part 68 is converted to P-polarized light by the ½ wavelength plate 69 is transmitted through polarization light beam splitter 70, and the luminous flux which synthesizes the polarized light components injected from the optical part 68 and 71, is injected from polarized light beam splitter 70. The luminous flux is converted to a circular polarized light IL' by the ¼ wavelength plate 74 and this illumination light IL' is incident on illuminance distribution compensation plate 9, as shown in FIG. 1. The illuminance distribution $E_{OUT}$ (r) of this synthesized illumination light, IL' is a flat annular shape as indicated in FIG. 6(d). In other words, the uniformization of illuminance distribution is carried out similar to using first flyeye lens 7 in FIG 1 by input optical system 5B of this embodiment. Furthermore, since the cross sectional geometry of illustration light IL' is formatted for an annular in this embodiment the usage efficiency of the illumination light is increased for the case where annular illumination is carried out.

A relay lens (not shown) is located on the plane of emergence of polarized light beam splitter 70 and the plane of emergence of polarization light beam splitter 70 and the plane of incidence of the flyeye lens 13 for annular illumination is almost conjugate due to this relay lens and the relay lens 10, as shown in FIG. 1. The cross sectional geometry at the plane of incidence of the flyeye lens 13, in FIG. 4(b), for illumination light IL', of FIG. 5, takes a shape where the annular like luminous flux (ILC) of the maximum cross section which is transmitted through the flyeye lens 13 is slightly enlarged. Thus, the loss of illumination light is reduced for the case where annular illumination is carried out.

As described in FIG. 1, this embodiment switches the aperture diaphragm (σ diaphragm) of the illumination, system by rotating the σ diaphragm unit 15, and the σ diaphragm is chosen from four types of σ diaphragm 75A–75D, as shown in FIG. 7(a).

In FIG. 7(a), the radius of aperture for the σ diaphragm 75A which is for a large σ value (coherence factor) is designated r α, the radius of aperture for σ diaphragm 75B which is for a small σ value is designated r α 1, the outer radius and inner radius of the annular aperture for the σ diaphragm 75C, which is for the number of the annular illumination, are designated r β and r β 2, respectively, the outer radius and inner radius of annular aperture for σ diaphragm 75D, which are for the second annular illumination are designated r β and r β 1, respectively.

In this embodiment the σ diaphragm for annular illumination 75C, 75D are used for the numerical aperture (NA) range of 0.5–0.6, and the σ diaphragm for circular aperture 75A, 75B are used for the numerical aperture (NA) range of 0.68–0.8. Also, the σ value of the illumination optical system is normally designated to be within the range of 0.6–0.8, and is set to a smaller range of 0.3–0.4 when the contact hole pattern is transferred. Therefore, if the projection magnification β of the projection exposure system (PL) is used the outer radius r β of the aperture for 75C, 75D of σ diaphragm for annular illumination, which is used when the numerical aperture (NA) is 0.6 or less, is designated as follows with the numerical aperture as a unit:

$$\beta 0.6*0.6 \leq r\beta < \beta*0.8*0.6 \qquad (11)$$

The inner radius r β 1 of the aperture of σ diaphragm 75D (⅔ annular) is set to (⅔) r β and the inner radius r β 2 of aperture of σ diaphragm 75C (½ annular) is set to (½) r β. With respect to the use of annular σ diaphragm 75C and 75D, the resolution of the resist pattern can be measured beforehand by carrying out a test print using the reticle of a transfer object and the σ diaphragm which gives better resolution can be used. On the other hand, the radius r α of σ diaphragm 75A used at the numerical aperture (NA) of 0.68 or greater, is set as follows using the numerical aperture as a unit. Note that an approximate numerical aperture 0.7 is used instead of the numerical aperture of 0.68.

$$\beta*0.6*0.7 \leq r\alpha < \beta*0.8*0.7 \qquad (12)$$

Figure 7B:
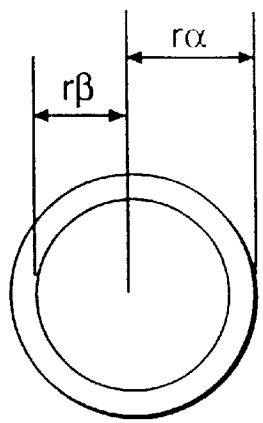
FIG. 7(b), the radius r β of the aperture for annular illumination.

Furthermore, as indicated in FIG. 7(b), the radius r β of the aperture for annular illumination is set to approximately 1 over 0.6/0.7 so that it would be smaller compared to radius r α of an aperture for a large σ value. Also, the radius r α 1 of σ diaphragm 75B for small σ value is set to approximately ½ of its radius r α, and the σ diaphragm 75B is used when the contact hole pattern is to be transferred.

Returning to FIG. 1, in the projection exposure device of this embodiment, when the numerical aperture (NA) of the projection exposure system (PL) is set to a range of 0.5–0.6 by the main control unit 29, the illumination control system 32 selects the flyeye lens 13 for annular illumination by exchange device 14, and sets either σ diaphragm 75C or 75D at the plane of exit of the flyeye lens 13 by driving the σ diaphragm unit 15. Furthermore, the illumination control system 32 selects the input optical system 5B by exchange device 8.

When the numerical aperture (NA) of the projection exposure system (PL) is set to a range of 0.68–0.8 by the main control unit 29, normal flyeye lens 12 is selected by the illumination system control system 32 and either of the circular σ diaphragms 75A or 75B is set to the plane of exit of the flyeye lens 12, and the input optical system 5A is selected. By this means the pattern on reticle (R) is transferred onto wafer (W), always at the optimal a value and without reducing the usage efficiency of the illumination light IL.

A description will now be provided regarding the resolution that is obtained when the pattern of reticle (R) is transfer exposed onto wafer (W) using the projection exposure device of this embodiment. First, the resolution R of the projected image by the projection exposure system (PL) is described below in equation (13) in a manner similar to equation (1) using the wavelength λ of the illumination light (IL) for exposure, k factor $k_1$ and numerical aperture (NA) of the projection exposure system (PL).

$$R=k_1 * \lambda/NA \tag{13}$$

If the depth of focus of the projected image of the projection exposure system (PL) is designated as D, then the depth of focus is given by equation (2) using the k factor $k_2$. Furthermore, if focus control accuracy $C_F$, the mark step difference (step difference of base pattern) $D_M$, resist thickness $T_R$, and the coefficient $K_{UD}$, which determines the usable depth of focus UDOF on the user side, are employed, there is a need for this embodiment to satisfy the "condition regarding the permissible range of the depth of focus" given next equation (14) below, which is the same as equation (6).

$$C_F+D_M+T_R*K_{UD} \leq D=k_2*\lambda/NA^2 \tag{14}$$

Additionally, in this embodiment, (a) the mark step difference $D_M$ is reduced to approximately 0.1 μm (or further to 0.05 μm) or less by introduction of wafer flattening technique, and at the same time (b) the focus control accuracy $C_F$ is reduced to 0.4 μm by improvement in the focus control technique. Furthermore, in this embodiment, even when the depth of focus (D) is narrowed by increasing the numerical aperture (NA) of the projection exposure system (PL) the resist thickness $T_R$ is thinned to approximately 0.2 μm (conventional embodiment being less than 1 μm) so that the condition regarding the permissible range of the depth of focus can be satisfied. Also, the coefficient $K_{UD}$ for determining the usable depth of focus UDOF is set to 0.7 and k factor is set to 1.7 in consideration of the narrowing of the line width.

Under these conditions, if the numerical aperture (NA) which satisfies equation (14) is designated $NA_2$, then since the wavelength λ is 248 nm, the numerical aperture $NA_2$ becomes:

$$0.4+0.1+0.2*0.7 \leq 1.7*0.248/NA_2{}^2; (NA_2 \leq 0.81) \tag{15}$$

Therefore, the condition regarding the permissible range of the depth of focus is satisfied even when the numerical aperture (NA) of the projection exposure system (PL) is increased to 0.81. Therefore, if the numerical aperture (NA) is set to 0.78 to provide a margin of error and inserting this value into equation (13), the resolution R takes the following value in equation (16). Note that the k factor $k_1$ is set to 0.55.

$$R=0.55*0.248/0.78=0.18 (\mu m) \tag{16}$$

This resolution 0.18 μm is the resolution of the circuit pattern corresponding to a 1 G-bit DRAM. However, when the resolution R becomes so small, since the k factor $k_2$ after optimization even smaller to a value of approximately 1.4, by inserting 1.4 into the k factor $k_2$ of equation (14), the upper limit for the numerical aperture (NA), which satisfies the condition regarding the permissible range of the depth of focus becomes 0.74. Also, by inserting 0.7, to provide some margin of error as numerical aperture (NA) of equation (13), the resolution R becomes approximately 0.19 μm. Therefore, with the projection exposure device of this embodiment, by using the KrF excimer laser light (wavelength 248 nm) as illumination light, setting the thickness of the photoresist on the wafer to approximately 0.2 μm, and setting the numerical aperture (NA) of the projection exposure system to approximately 0.7–0.74, a circuit pattern of a semiconductor device corresponding to a 1 G-bit DRAM can be transferred to a wafer with high accuracy while satisfying the condition regarding the permissible range of the depth of focus.

Note that there are actually cases where the resist thickness $T_R$ is set to approximately 0.5 μm, and for such cases, the upper limit of numerical aperture (NA) of the projection illumination system, which satisfies the condition regarding the permissible range of the depth of focus would be approximately 0.7 (with $k_2$ as 1.7), but the numerical aperture (NA) can be set to 0.68 for margin of error. Therefore, when the resist thickness $T_R$ is set to approximately 0.5 μm or less, the condition regarding the permissible range of the depth of focus can be satisfied even when the numerical aperture (NA) is set to 0.68 or less.

In this embodiment, when the numerical aperture of the projection exposure system (PL) is set to the range of 0.5–0.6, for example at 0.55, as can be understood from equations (9) and (10) described previously, a circuit pattern of a semiconductor device corresponding to a 256 M-bit DRAM can be transferred while satisfying the condition regarding the permissible range of the depth of focus even when the thickness of photoresist is set to approximately 1 μm. Also, by carrying out annular illumination, resolution corresponding to a 256 M-bit DRAM can be obtained with certainty. In other words, according to the projection exposure device of this embodiment, circuit patterns corresponding to two generations of semiconductor devices can be formed by switching the numerical aperture of the projection exposure system.

In this regard, the time for the complete exposure process would double when the wafer flattening technique was added. Therefore, conventionally the projection exposure device which carries out the exposure to the critical layer, which requires such wafer flattening and the projection exposure device which carries out exposure to other rough layer were separate devices. The process management was complicated since the projection exposure device was switched for a single wafer under the so-called mix-and-match method. However, in this embodiment, the manufacturing line can be simplified and process management easier since a single projection exposure device can carry out exposure for almost any layer of a single wafer.

Note that while KrF excimer laser light is used as exposure illumination lights, in the embodiment described above, it is possible to use an ArF excimer laser light (wavelength 193 nm) as well. Therefore, the possible resolution and other quantities will be assessed for the case where ArF excimer laser light is used. It is assumed that systems such as the projection exposure system (PL) will be optimized for a wavelength of 193 nm. In this case, by reducing the mark step difference to approximately 0.1 μm by the wafer flattening technique, the resist thickness $T_R$ is thinned to approximately 0.2 μm and the coefficient $K_{UD}$ for setting the usable depth of focus is set to 0.7. Furthermore, by improving the focus control technique it is assumed that focus control accuracy $C_F$ can be increased to 0.2 μm. Also, k factor $k_2$ is set to 1.5 in consideration for the narrowing of the line width.

With the above stated conditions present, if the aperture (NA) which satisfies the condition regarding the permissible range of the depth of focus in equation (14) is set to $NA_2$, since the wavelength λ is 193 nm, the numerical aperture $NA_2$ becomes as follows:

$$0.2+0.1+0.2*0.7 \leq 1.5*0.193/NA_2^2, NA_2 \leq 0.81 \quad (17)$$

In other words, the condition regarding the permissible range of the depth of focus is satisfied even when the numerical aperture (NA) is increased to 0.81. If the numerical aperture (NA) is set to 0.73, to give a margin of error, and this value was inserted into equation (13), the resolution R, would have the following value. Note the k factor is set to 0.45 to account for line width.

$$R=0.45*0.193/0.7=0.12 \ (\mu m) \quad (18)$$

This resolution of 0.12 μm is the resolution of the circuit pattern corresponding to a 4 G-bit DRAM. Therefore, in the projection exposure device of this embodiment, by using an ArF excimer laser light (wavelength 193 nm) as the illumination light, setting the thickness of photoresist on the wafer to approximately 0.2 μm, and setting the numerical aperture (NA) of the projection exposure system to approximately 0.73, a circuit pattern of semiconductor device corresponding to a 4 G-bit DRAM can be transferred to a wafer with high accuracy while satisfying the condition regarding the permissible range of the depth of focus.

Similarly, when an ArF excimer laser light is used, by setting the numerical aperture (NA) of the projection exposure system (PL) to a range of 0.5–0.6, a circuit pattern of a semiconductor device corresponding to a 1 G-bit DRAM can be transferred while satisfying the condition regarding the permissible range of the depth of focus even when the thickness of photoresist is set to approximately 1 μm. In this case, by carrying out annular illumination as well, a resolution corresponding to a 1 G-bit DRAM can be obtained with greater certainty. In other words, circuit patterns corresponding to two generations of semiconductor devices can be formed using a single projection exposure system.

Furthermore, when the i-line of a mercury lamp is used as illumination light in the projection exposure device, of this embodiment, by setting the numerical aperture (NA) of the projection exposure system (PL) to a range of 0.7–0.8 and setting the thickness of photoresist to approximately 0.2 μm, the circuit pattern of the semiconductor device corresponding to a 256 M-bit DRAM can be transferred while satisfying the condition regarding the permissible range of the depth of focus. On the other hand, when the numerical aperture is set to approximately to a range of 0.5–0.6, the circuit pattern of semiconductor device corresponding to a 64 M-bit DRAM can be transferred with high accuracy. In this case, by carrying out annular illumination as well, resolution corresponding to a 64 M-bit DRAM can be obtained with greater certainty. As a result, according to the projection exposure device of this embodiment, circuit patterns corresponding to two generations of semiconductor devices can be formed.

It should be noted that the metal vapor laser light, high modulation wave of a YAG laser, or other bright-line can be used as an exposure illumination light, and for these cases resolution can be improved while satisfying the condition regarding the permissible range of the depth of focus by making the photoresist thin and increasing the numerical aperture of the projection exposure system.

Furthermore, if the mark step difference $D_M$ is decreased and resist thickness $T_R$ can be made thinner, with future advancements in the flattening techniques, then the resolution R can be increased further since the condition regarding the permissible range of the depth of focus can be satisfied more easily.

This embodiment further employs a wafer flattening technique :as one method of satisfying the condition regarding the permissible range of the depth of focus of equation (14). If wafer flattening is carried out in this manner the mark step difference $D_M$ which is the step difference of the circuit pattern formed upon wafer (W), is decreased to approximately 50 nm or less, and the step difference of the wafer mark for alignment placed on each shot region on the wafer (W) decreases as well. Therefore, this embodiment is also equipped with a sensor capable of detecting a low step difference mark as the alignment sensor for carrying out alignment of each shot region.

In FIG. 1, alignment sensor 50 is located on the side part of the projection exposure system (PL). This alignment sensor is constructed in a manner similar to alignment sensor disclosed in Patent Appl. Pub. number H5-217835.

Figure 8:
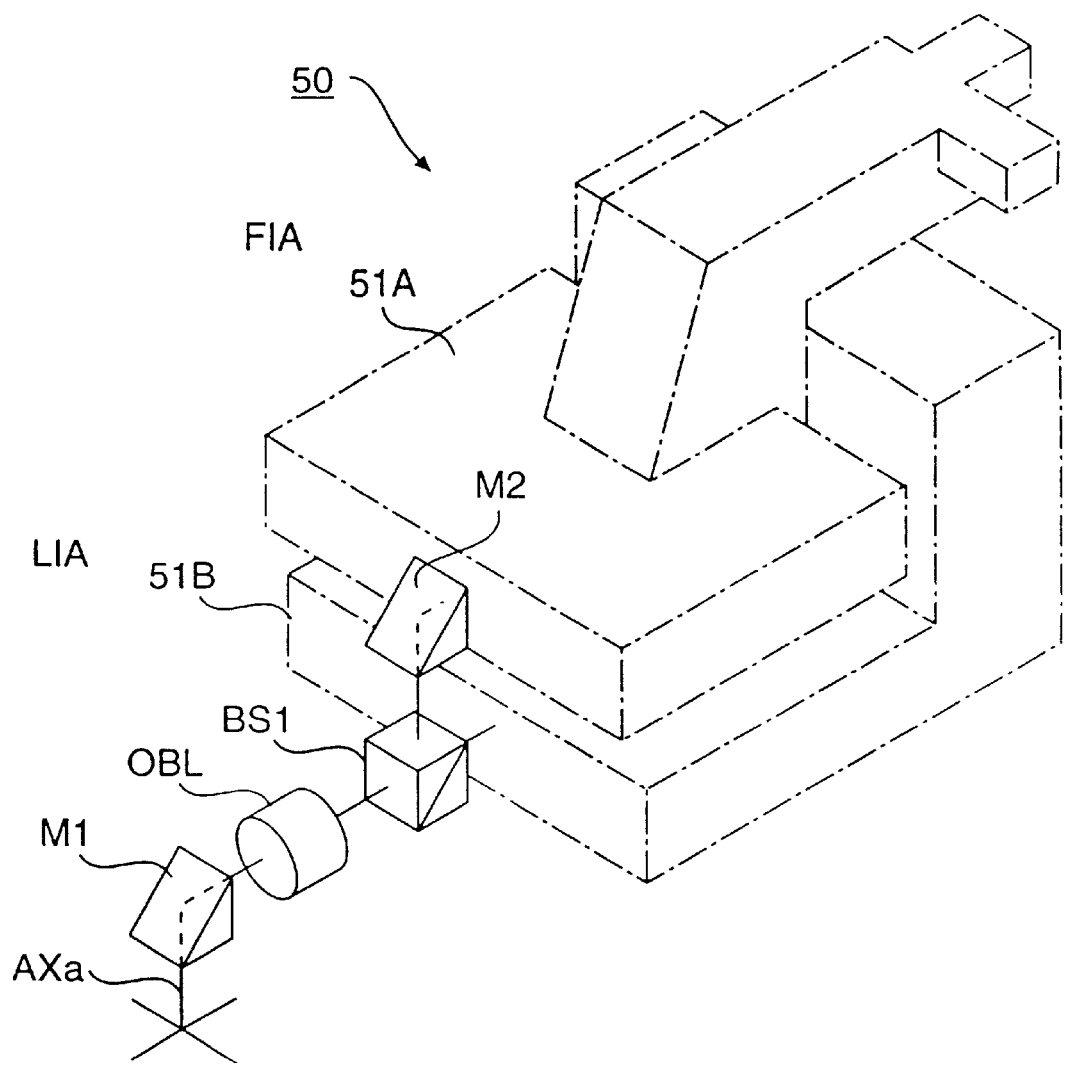
FIG. 8 is an oblique view of the projection exposure device depicting the schematic composition of the alignment sensor 50.

FIG. 8 is an oblique view schematically showing the complete construction of this alignment sensor 50, where the reflected light from the lattice like wafer mark (not shown) formed upon the wafer is reflected by mirror M1, incident on objective lens (OBL), then split by beam splitter 1. The luminous flux reflected at beam splitter BS1 is incident on detection system image method. In this embodiment, FIA (Field Image Alignment) 51A (referred to as "FIA system" hereafter) placed at the upper stage portion of the alignment sensor 50 after reflection from mirror M2. Conversely, the luminous flux transmitted through beam splitter BS1 is incident on the detection system of the two luminous flux interference method, that is, the LIA (Laser Interferometric Alignment) method 51 B placed on the lower stage portion.

Figure 9:
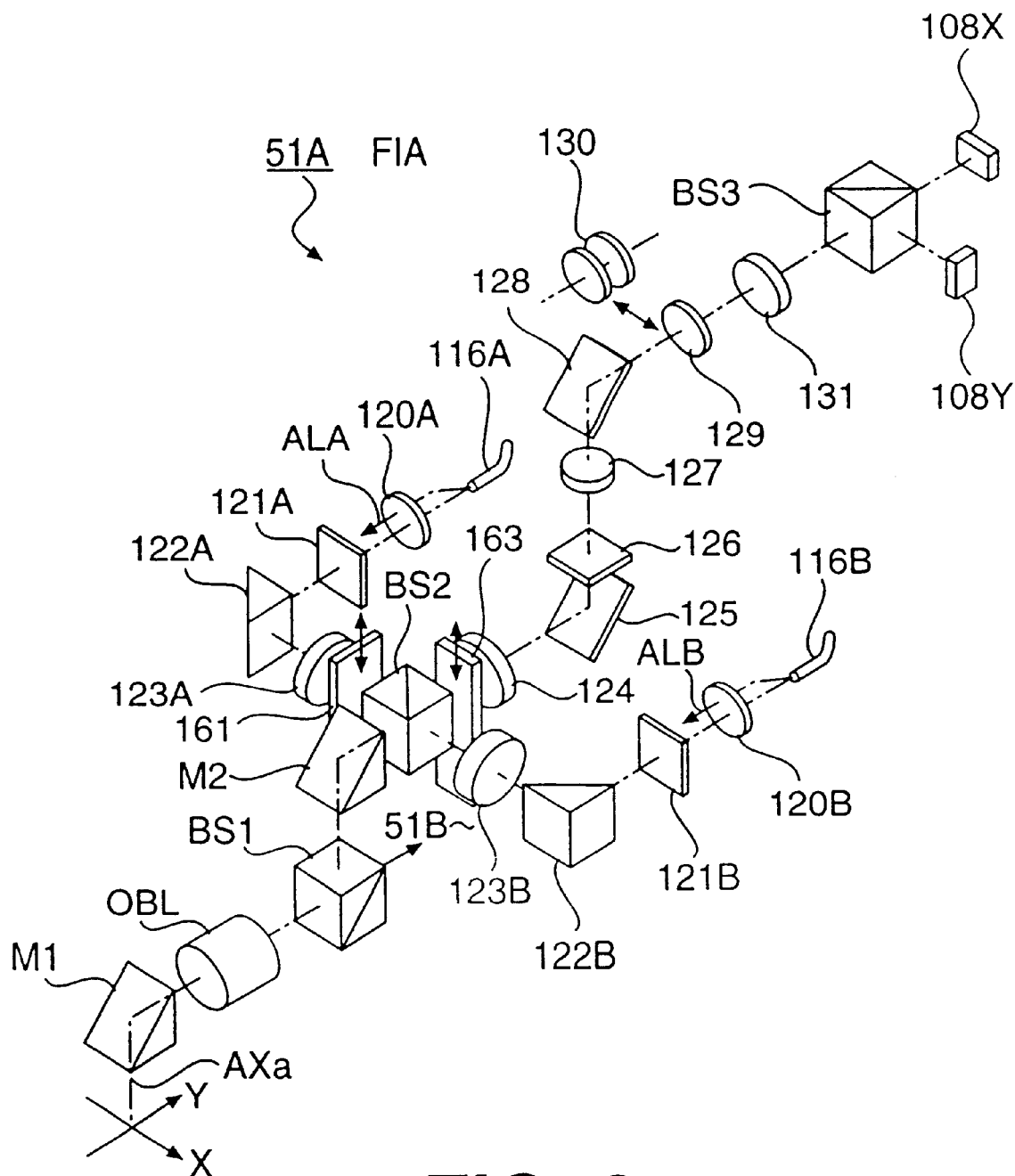
FIG. 9 is an oblique view depicting the (FIA) system 51A of FIG. 8.

FIG. 9 depicts the composition of the (FIA) system 51A and the illumination light (ALA) in the non-photosensitive broadband (bandwidth of greater than 270 nm) emerges from the optical fiber 116A against the photoresist on the wafer and this illumination light (ALA) illuminates wafer illumination field diaphragm 121A at uniform illuminance by condenser lens 120A. The illumination light restricted field diaphragm 121A is reflected by mirror 122, and is then incident on the illumination system aperture diaphragm plate 161 by the lens system 123A. Multiple types of aperture diaphragms (referred to as "σ diaphragm hereafter") are placed on the illumination system aperture diaphragm plate 161 as described below, which is constructed so that the desired σ diaphragm can be selected by sliding the illumination system diaphragm plate 161.

The illumination light (ALA) which is transmitted through the designated σ diaphragm in the illumination system aperture diaphragm plate 161 is incident on beam splitter BS2 and the illumination light (ALA) reflected by beam splitter BS2 is reflected by mirror M2 and is incident on beam splitter BS1. Afterwards, the illumination light (ALA) illuminates the wafer mark on the wafer along optical-axis AXa and by objective lens (OBL) and mirror M1. On this illumination light path for the wafer, field diaphragm plate 121A is conjugated in regard to the lens system 123A and objective lens (OBL) with the wafer, and the illumination region against the wafer by the (FIA) system 51A is defined unilaterally by the aperture formed upon field diaphragm plate 121A.

Reflection light is then generated from the wafer illuminated by the illumination light (ALA) from the optical fiber 116A and this reflection light is incident on beam splitter BS2 by mirror M1, objective lens (OBL), beam splitter BS1, and mirror M2. Approximately ½ of this reflection light is transmitted through the beam splitter BS and is incident on the detection optical system. This detection optical system is composed of an aperture diaphragm plate 163, a first relay lens system 127 for imaging, mirror 128, an interference filter 129, a second relay lens system 131, and a beam splitter BS3. Multiple types of aperture diaphragms are placed on the aperture diaphragm plate 163, configured so that the desired aperture diaphragm can be selected by sliding the aperture diaphragm plate 163.

The return light from the wafer which is transmitted through the designated aperture diaphragm in aperture diaphragm plate 163 is incident on beam splitter BS3 by lens system 124 and the return light split by beam splitter BS3 is incident on imaging element 108X for X-direction detection and imaging element 108Y for Y-direction detection, both composed of the two dimensional CCD and forms an image of the indicator mark and an image of the wafer mark on the wafer surface on the imaging surface of each imaging element 108X and 108Y.

In other words, in regard to the objective lens (OBL) and synthesis system of lens system 124, the wafer surface and indicator plate 126 is conjugated, while in regard to the relay lens system 127 and 131, the indicator plate 126 and their imaging surfaces are conjugated. Also, it is configured so that the variable power optical system 130 can be inserted near the interference filter 129 so that the magnification of the image of the wafer mark and the indicator plate can be changed. Also, the interference plate 129 serves the role of shielding the strong laser light used in the LIA system described below.

FIG. 9 further illustrates an illumination system placed to independently illuminate the indicator plate 129. This illumination system is includes an optical fiber 116B, condenser lens 120B, illumination field diaphragm plate 121B, mirror 122B, and lens system 123B. The illumination light emerging from optical fiber 116B is incident on the beam splitter BS2 from the side opposite to the optical path of illumination light (ALA) for the wafer, by condenser lens 120B-lens system 123B, and is then reflected by beam splitter BS2 and illuminates the indicator plate 126.

The imaging signal of imaging element 108X, 108Y is supplied to the alignment signal processing system 52 in FIG. 1, and by image processing these imaging signals in the alignment signal processing system 52, the position of the wafer mark on the detection object is detected and this detection result is supplied to main control unit 29. Based on the position of each wafer mark the alignment of wafer (W) is carried out in the main control unit 29.

Figure 10:
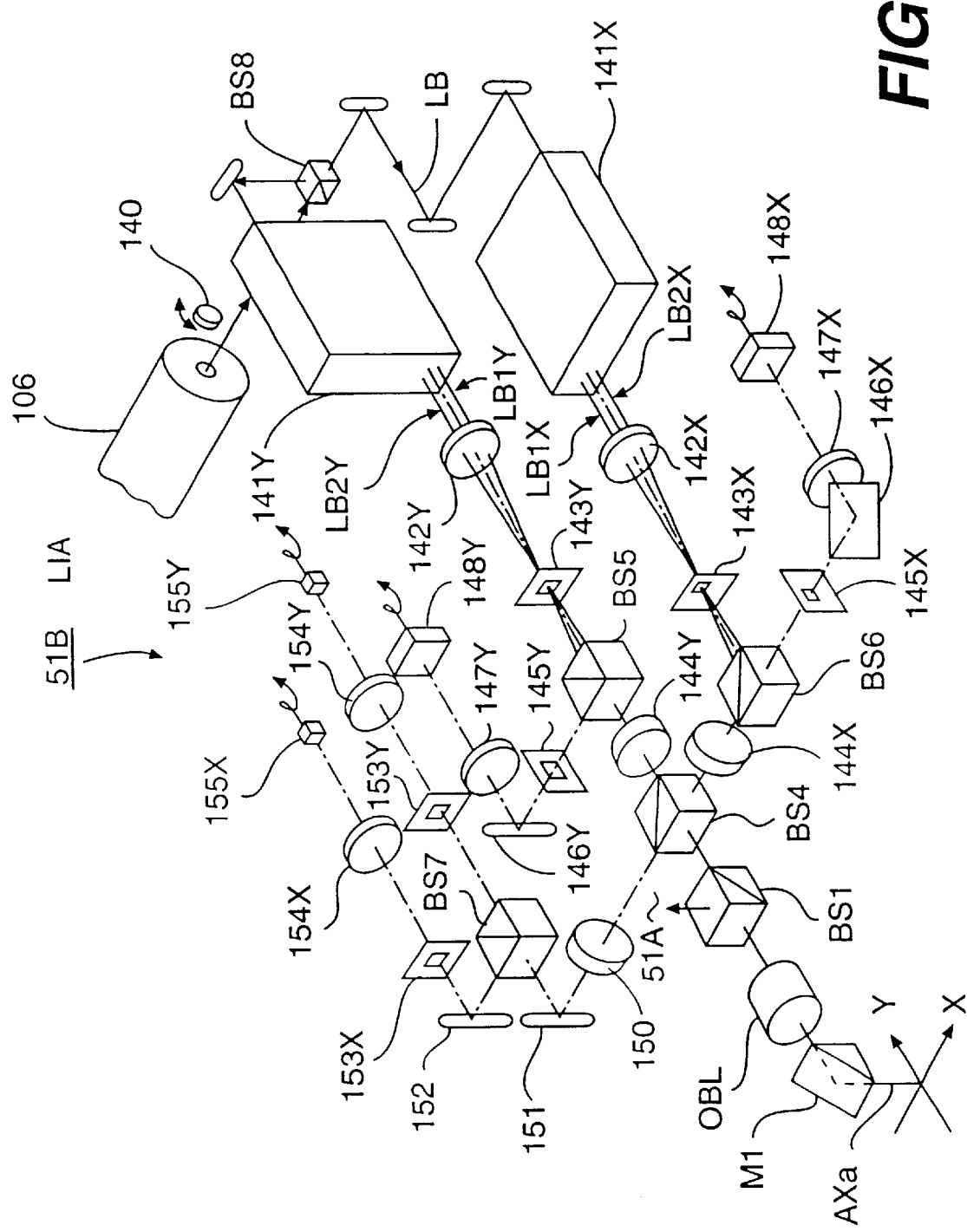
FIG. 10 is an oblique view depicting the (LIA) system 51B of FIG. 8.

Next, FIG. 10 shows the composition of the LIA system 51B, where in FIG. 10, the laser beam from a He—Ne laser light source 106 is divided by the beam splitter BS8 by shutter 140. The laser beam LB which is transmitted through beam splitter BS8 is incident on the heterodyne double, luminous flux unit 141X by multiple turning mirror in the LIA system in the X-direction. In this heterodyne two luminous flux unit 141X is located a pair of frequency shifters of different drive frequency (acousto-optical element) and a synthesis system which synthesizes the laser beam emerging from the frequency shifter, which have received frequency modulation, parallel to the optical-axis. The two laser beams LB1x, LB2x emerging from the synthesis system is incident on the lens system 142X, and uniformly illuminates the aperture plate 143X placed on the backside focus surface of the lens system 142X. Therefore, a one-dimensional interference band will be formed by the crossing of two laser beams LB1x, LB2x on the aperture plate 143X. Furthermore, since the drive frequencies of the pair of frequency shifters in the heterodyne two luminous flux unit 141X differ from one another this one-dimensional interference band flows in the pitch direction at a speed corresponding to the frequency difference.

The two laser beams, restricted by the aperture plate 143X, are partially reflected by beam splitter BS6, and after passing through lens system 144X beam splitter BS4 and beam splitter BS1 reach the wafer by objective lens (OBL) and mirror M1. Since the two laser beams LB1x, LB2X are symmetrically inclined from the X-direction, they illuminate the lattice shaped X-axis wafer mark located on the wafer and a plus-minus first order diffraction light is generated normal to the wafer mark. These two plus-minus first order diffraction lights interfere with each other since the polarization direction is the same, and at the same time the interference intensity varies periodically at the frequency difference of the pair of the frequency shifters, i.e. at the beat frequency.

This interference beat light is incident on beam splitter BS6 by mirror M1, objective lens (OBL), beam splitter BS1, BS4, and lens system 144X, and the interference beat light transmitted through this beam splitter BS6 reaches the reception aperture plate 145X. The reception aperture plate 145X is placed in a position conjugate to the lens system 144X in regard to the objective lens (OBL), and possesses an aperture which only allows the interference beat light to be transmitted. The interference beat light transmitted through aperture plate 145X reaches photoelectric sensor 148X by mirror 146X and lens system 147X and the beat signal is output from photoelectric sensor 148X The laser beam reflected by beam splitter BS8 is incident on LIA system for the Y-direction by a mirror. This LIA system for the Y-direction is comprised of the following, almost symmetrical with the LIA system for the X-direction: heterodyne two luminous flux unit 141Y, lens system 142Y, aperture plate 143Y, beam splitter BS5, lens system 144Y, reception aperture plate 145Y, mirror 146Y, lens system 147Y, and photoelectric sensor 148Y. However, the heterodyne two luminous flux unit 141Y is placed at a 90 degree angle from the heterodyne two luminous flux unit 141X, and the two laser beams LB1y, LB2y from the heterodyne two luminous flux unit 141Y are emitted so that they cross in the Y-direction against the Y-axis wafer mark on the wafer. Thus, the beat signal corresponding to the Y-axis wafer mark is output from the photoelectric sensor 148Y.

In order to obtain the reference signal from the beat signal from photoelectric sensor 148X and 148Y, the laser beam from laser beam LB1x and LB2x transmitted through beam splitter BS4 and the laser beam from laser beam LB1y and LB2y reflected by beam splitter BS4 are incident on beam slitter BS7 by lens system 150 and mirror 151. The laser beam reflected by beam splitter BS7 is incident on transmission type diffraction lattice plate 153X by mirror 152. Transmission type diffraction lattice plate 153X forms a diffraction lattice at a position conjugated with the aperture of X-axis reception aperture plate 145X, with the rest as a shield section, and laser beam LB1x and LB2x are incident on the diffraction latticed, the interference beat light composed of plus-minus first order diffraction light generated from this diffraction lattice is incident on photoelectric sensor 155X by lens system 154X for Fourier conversion, and reference signal for the X-axis is output by photoelectric sensor 155X.

The laser beam transmitted through beam splitter BS7 is also incident on the transmission type diffraction lattice plate 153Y. Transmission type diffraction lattice plate 153Y forms a diffraction lattice at a position conjugated with the aperture of the Y-axis reception aperture plate 145X, with the rest as a shield section, and laser beam LB1y and LB2y are incident on the diffraction lattice, the interference beat light composed of plus-minus first order diffraction light generated from this diffraction lattice is incident on photoelectric sensor 155Y by lens system 154Y for Fourier conversion, and the reference signal for the Y-axis is output by the photoelectric sensor 155Y.

The beat signal from photoelectric sensor 148X and 148Y, the reference signal from photoelectric sensor 155X and 155Y are each supplied to the alignment signal processing system 52 that detects the position of the wafer mark of the detection object for X-axis and Y-axis and supplies the detection results to the main control unit 29. In the main control unit 29 the alignment of wafer (W) is carried out based on the position of each wafer mark.

As described above, the alignment sensor 50 of this embodiment is equipped with (FIA) system 51A and LIA system 51B. In this case, (FIA) system 51A is capable of detecting a wafer mark having a step difference of 100 nm (0.1 $\mu$m) or greater at high SN ratio, and since it is an image processing method it can carry out position detection for the wafer marks having asymmetry, or the wafer marks having a rough surface. On the other hand, the LIA system 51B is capable of detecting the low step difference mark (step difference of approximately 50 nm or less) at high accuracy. Therefore, by employing (FIA) system 51A for the high step difference mark and LIA system 51B for the low step difference mark it can cope with all manner of semiconductor devices.

In this embodiment the numerical aperture (NA) of the projection illumination system (PL) is set to 0.6 or less when the mark step difference $D_M$ is high and the numerical aperture (NA) is set to 0.68 or greater when the mark step difference $D_M$ is low. In other words, normally in this embodiment, the alignment sensor is switched so that (FIA) system 51A is employed when the numerical aperture (NA) of the projection illumination system (PL) is set to 0.6 or less and the LIA system 51B is used when the numerical aperture (NA) is set to 0.68 or greater. However, if the pitch of the wafer mark place in each shot region on the wafer is 8 $\mu$m the detection range (capture range) by the LIA system 51B is within plus-minus 2 $\mu$m, so that there is a need to carry out a rough position detection (search alignment) of the wafer mark prior to final alignment (fine alignment) using the LIA system 51B. Therefore, in this embodiment as described below, a mechanism which is capable of detection of a low step difference mark is added to the (FIA) system 51A, so that the search alignment for the wafer mark with a low step difference can be carried out using the (FIA) system 51A switched to the detection of a low step difference mark.

The detection mechanism for a low step difference mark by the (FIA) system 51A will not be described in detail. FIG. 11(*a*) is a schematic diagram simplified by removal of mirrors from the (FIA) system 51A of FIG. 9. In FIG. 11(*a*), the illumination light (ALA) emerging from optical fiber 116A is injected along optical-axis AXa into the illumination system aperture diaphragm plate 161 by condenser lens 120 and the lens system 123. The illumination light transmitted through the designated $\sigma$ diaphragm of illumination system aperture diaphragm plate 161 is incident on beam splitter 162 and the illumination light transmitted through beam splitter 162 illuminates the wafer mark on wafer (W) by objective lens (OBL). Also, the solid line optical path of illumination light (ALA) in FIG. 11(*a*) shows the conjugated relationship with the wafer mark. The dotted line optical path indicates the conjugated relationship with the pupil. In other words, the illumination system aperture diaphragm plate 161 is positioned on an optical Fourier conversion place (illumination system pupil plane) HF1 of the formation surface of the wafer mark 165.

As indicated in FIG. 11(*b*), the normal $\sigma$ diaphragm 166A, annular $\sigma$ diaphragm 166B, and modified (in a limited sense) $\sigma$ diaphragm 166C comprised of four circular aperture offsets from the optical-axis are formed upon the illumination system aperture diaphragm plate 161. It is comprised so that the desired $\sigma$ diaphragm of the three $\sigma$ diaphragms can be set on the optical path of the illumination light (ALA) by sliding the illumination system aperture diaphragm plate 161 in the direction normal to the optical-axis AXa. In this example, normal $\sigma$ diaphragm 166A is used when a high step difference mark with the mark step difference $D_M$ of 100 nm or more is detected and an annular $\sigma$m diaphragm 166B or modified $\sigma$ diaphragm 166C is used when a low step difference mark with-the mark step difference $D_M$ of 100 nm or less is detected. In other words, the annular $\sigma$ diaphragm 166B or modified $\sigma$ diaphragm 166C is used as outline emphasis filter of the illumination system side for emphasizing the phase (step difference) of the phase object with an uneven surface.

As shown in FIG. 11(*a*), the returning light from the wafer mark 165 returns to beam splitter 162 by objective lens (OBL) and the returning light reflected by beam splitter 162 forms the image of wafer mark on the imaging surface of imaging element 108Y along optical-axis AXb by aperture diaphragm plate 163 and imaging lens 164. The aperture diaphragm plate 163 is placed on the optical Fourier conversion plane (pupil plane) HF2 for the formation surface of the wafer mark 165.

As indicated in FIG. 11(*c*), the normal aperture diaphragm 167A, annular aperture diaphragm 167B, and modified (in a limited sense) aperture diaphragm 167C comprised of four circular apertures offset from the optical-axis, are formed upon the aperture diaphragm plate 163. It is comprised so that the desired aperture diaphragm of these three aperture diaphragms can be set on the optical path of the returning light by sliding the aperture diaphragm plate 163 in the direction normal to the optical-axis AXb. In this example, the normal aperture diaphragm 167A is used when the high step difference mark with the mark step difference $D_M$ of 100 nm or more is detected. The annular aperture diaphragm 167B or modified aperture diaphragm 167C is used when the low step difference mark with the mark step difference $D_M$ of 100 nm or less is detected. In other words, annular aperture diaphragm 167B or modified aperture diaphragm 167C is used as an outline emphasis filter for emphasizing the phase (step difference). Therefore, since outline emphasis filter composed of the annular $\sigma$ diaphragm 166B or modified $\sigma$ diaphragm 166C and an annular aperture diaphragm 167B or modified aperture diaphragm 167C is used in this embodiment. The image of the low step difference can be detected at high contrast.

Figure 12A:
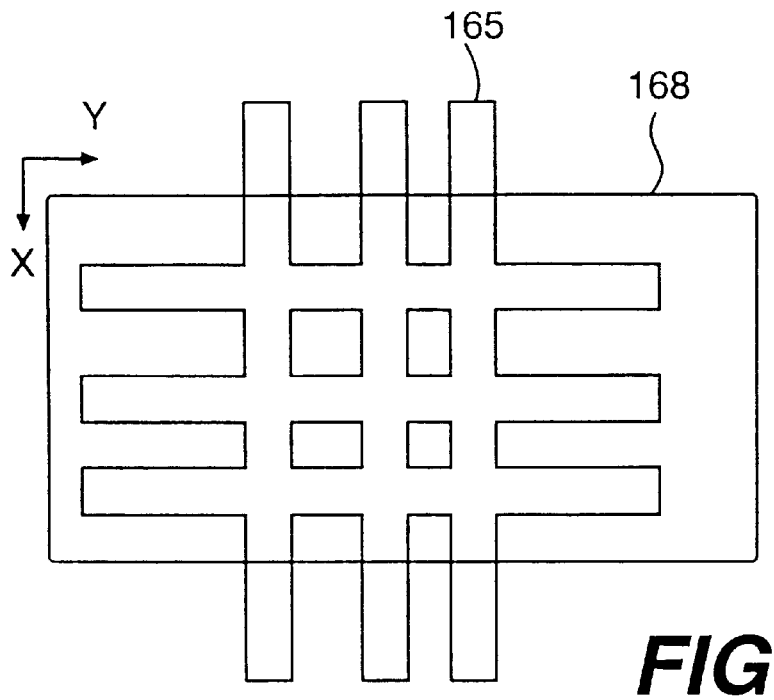
FIG. 12(a), depicts a two-dimensional mark (a mark used for both X-axis and Y-axis) composed of three protruding or receding marks at different spacing in both the X and Y-directions.

The switching of the σ diaphragm and aperture diaphragm is unconditionally performed by annular diaphragms 166B and 167B, or modified diaphragm 166C and 167C when the numerical aperture (NA) of the projection exposure system (PL) is 0.68 or greater. On the other hand, when the numerical aperture is 0.6 or less, the mark step difference $D_M$ is normally high. However, depending upon usage the low step difference mark may be used when the numerical aperture (NA) is 0.6 or less since the condition regarding the permissible range of the depth of focus is satisfied. Therefore, when the numerical aperture is set to 0.6 or less and exposure is carried out for one lot of wafers the determination of the high or low of the step difference of the wafer mark may be carried out by the first wafer of the lot as follows:

First, the imaging signal SY from the imaging element 108Y is input at the first wafer of the lot. As indicated in FIG. 12(a), a two-dimensional mark (a mark used for both X-axis and Y-axis) composed of three protruding or receding marks at different spacing in both the X and Y-directions is assumed for the wafer mark 165. The signal, which averages the imaging signal SY, output from the imaging element 108Y within the rectangular observation field 168, which includes the wafer mark 165, is used to distinguish the wafer mark 165 from other marks and for position detection in the Y-direction.

Figure 12B:
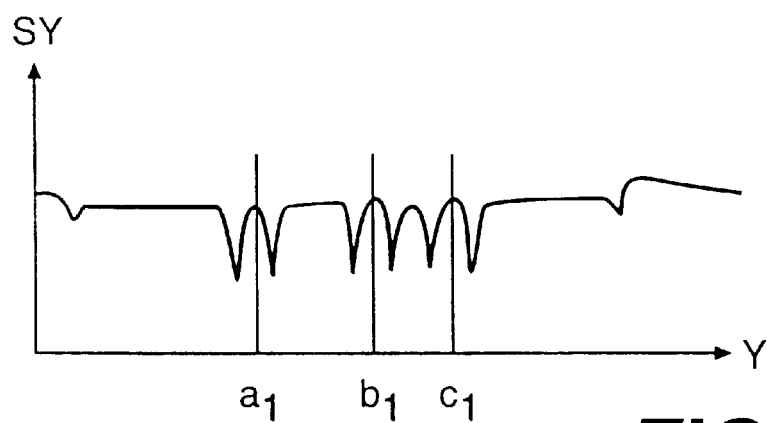
FIG. 12(b) depicts the imaging signal SY obtained when the large circular σ diaphragm 166A and aperture diaphragm 167A are utilized.
Figure 12C:
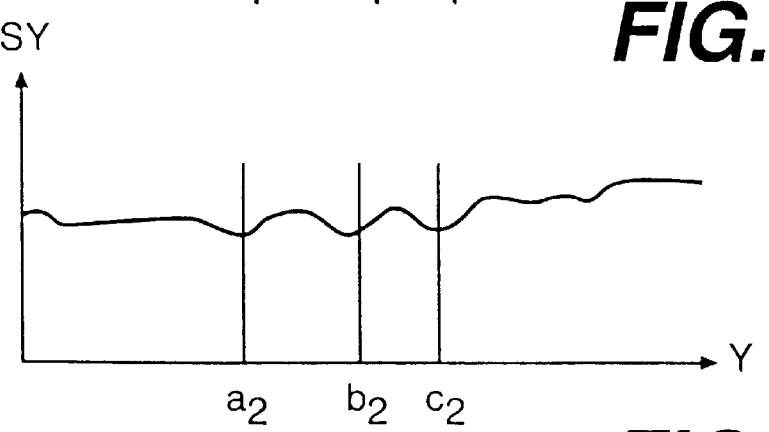
FIG. 12(c) depicts the imaging signal SY obtained when the annular σ diaphragm 166B and aperture diaphragm 167B or modified σ diaphragm 166C and aperture diaphragm 167C are utilized.

FIG. 12(b) shows the imaging signal SY obtained when the large circular σ diaphragm 166A and aperture diaphragm 167A are used, while FIG. 12(c) shows the imaging signal SY obtained when the annular σ diaphragm 166B and aperture diaphragm 167B or modified σ diaphragm 166C and aperture diaphragm 167C are used. Note that imaging signal SY is shown as a function of the Y-coordinate within the observation field 168. The imaging signal SY in FIG. 12(c) has a high contrast even when the mark step difference of wafer mark 165 is 100 nm or more, and the position in the Y-direction for the three marks a1, b1, and c1 can be detected with high accuracy. In other words, as the mark step difference $D_M$ decreases from approximately 100 nm to 10 nm the contrast of imaging signal SY of FIG. 12(b) becomes lower and the unevenness is reduced, while imaging signal SY of FIG. 12(c) retains sufficient contrast for detection where the outline of the uneven mark is emphasized by changing the illumination condition.

When exposure to a lot of wafer is carried out with the numerical aperture (NA) of the projection exposure system (PL) set to 0.6 or less, detection is carried out by using the (FIA) system 51A for the first wafer, while also selecting a large circular σ diaphragm 166A and aperture diaphragm 167A, and then obtaining the contrast C1 of the obtained imaging signal SY, as shown in FIG. 12(b). When contrast C1 is smaller than the designated standard value detection is carried out by setting annular σ diaphragm 166B or modified σ diaphragm 166C, at the illumination system aperture diaphragm plate 161, and setting the annular aperture diaphragm 167B or modified aperture diaphragm 167C at the aperture diaphragm plate 163, thereby obtaining the contrast C2 of the imaging signal SY of FIG. 12(c). Next, the contrast C1 obtained initially and contrast C2 obtained next are compared. The detection condition which gives the higher contrast is selected and for the subsequent wafers of the lot, the detection of the wafer mark is carried out by setting (FIA) system 51A to the selected detection condition. This has the advantage that the wafer mark can be detected at a detection condition with high contrast in cases where it is not known whether the step difference of the wafer mark is greater or less than 100 nm, or is near 100 nm.

The contrast of imaging signal SY obtained when diaphragm 166B and 167B or 166C and 167C are switched can be compared and the diaphragms giving greater contrast can be used. Also, the annular σ diaphragm 166B and an annular aperture diaphragm 167B need not be combined so that any combination can be used that gives high contrast of the imaging signal SY obtained. Furthermore, in the example of FIG. 11, σ diaphragm for light and shade (amplitude distribution) are used as aperture diaphragm 167A–167C, but the phase filter which changes the phase distribution of the luminous flux transmitted through the pupil place can be used to carry out outline emphasis of low step difference marks.

According to the first one exposure method of this invention, it has the advantage that by increasing the numerical aperture of the projection exposure system when the mark step difference is low and the photosensitive material is thin the resolution can be improved further and the condition regarding the permissible range of the depth of focus can be satisfied without making the wavelength of the exposure illumination light shorter. Also, sufficiently high resolution can be obtained with the illumination condition in the normal illumination condition even when the numerical aperture is large.

In other words, by this invention, a pattern corresponding to the next generation 256 M-bit DRAM can be formed using the i-line of mercury lamp as the exposure illumination light, a pattern corresponding to next the generation 1 G-bit DRAM can be formed using KrF excimer laser light, and a pattern corresponding to the next generation 4 G-bit DRAM can be formed using an ArF excimer laser light, so that the cost performance of the exposure device increases.

On the other hand, when the mark step difference is high and the photosensitive material is thick, the resolution can be increased somewhat by making the numerical aperture of the projection exposure system small to satisfy the condition regarding the permissible range of the depth of focus and switching to modified illumination condition. Thus, it becomes possible to form a pattern corresponding to two generation of semiconductor device with one exposure device without changing the wavelength of the exposure illumination light, so that the process management for the exposure device previously carried out for separate line can be reduced to just one device. Therefore, process management becomes easier, and the process management time is shortened so that the throughput for the exposure process is increased.

Note that by switching the numerical aperture of the projection exposure system in two stages in this invention, patterns corresponding to two generations of semiconductor devices can be formed, but it can be switched between three or more stages according to the mark step difference or thickness of photosensitive material. Thus, high resolution can be obtained while satisfying the condition regarding the permissible range of the depth of focus according to such a factor as the thickness of the photosensitive material.

Also, according to the exposure device of this invention, the first exposure method of this invention can be employed. Furthermore, the illumination condition switching method sets the illumination optical system to a normal illumination condition when the numerical aperture of the projection exposure system is set to 0.68 or greater, and sets the illumination optical system to modified illumination condition when the numerical aperture of the projection exposure system is set to 0.6 or less. For example, if the mark step difference is approximately 0.1 µm or less and the thickness of photosensitive material is approximately 0.5 µm or less the aperture number is set to 0.68 or greater, and when the the mark step difference is approximately 0.8 μm and the thickness of photosensitive material is approximately 1 μm the aperture number is set to 0.6 or less. Thus, the condition regarding the permissible range of the depth of focus can be satisfied while obtaining high resolution according to such factor as thickness of the photosensitive material.

The illumination condition switching method is comprised of a luminous flux splitting system which splits the illumination light for exposure into first and second luminous fluxes. The first luminous flux diffusion system for spreading the cross section of the first luminous flux in a ring shape second luminous flux diffusion system for spreading the cross section of the second luminous flux in an annular shape, a luminous flux synthesis system which synthesize the luminous flux from first and second luminous flux system in front of illumination pupil plane. When the modified illumination condition is being set this illumination condition switching method guides the luminous flux synthesized in the luminous flux synthesis system to the illumination system pupil system and carries out annular illumination only the annular secondary light source portion on the illumination pupil plane is illuminated at a uniform illuminance distribution. Therefore, the usage efficiency of illumination light increases and high illuminance is obtained on the mask (on the photosensitive substrate), and the illuminance distribution on the mask becomes uniform.

According to the second exposure method of this invention, when the mark step difference of the position matching mark is low and the photosensitive material is thin it has an advantage where the resolution can be increased without making the wavelength of the exposure illumination light shorter by increasing the numerical aperture of the projection exposure system, while also satisfying the condition regarding the permissible range of the depth of focus. Also, by switching in the alignment optical system to detection condition for outline emphasis when the mark step difference is small the position matching mark can be detected at high accuracy. On the other hand, when the mark step difference is high and the photosensitive material is thick the numerical aperture is decreased so as to satisfy the condition regarding the permissible range of the depth of focus, but its position matching mark can be detected at high accuracy even if the alignment optical system is set to normal detection condition since the mark step difference is high. Thus, position detection can be carried out at high accuracy even when the mark step difference changes and high overlay accuracy can be maintained.

In this case, if the alignment optical system is set to detection condition for outline emphasis when the numerical aperture for the projection system is set to 0.68 or greater, while the alignment optical system is set to normal detection condition when the numerical aperture for the projection system is set to 0.6 or less, the cases where numerical aperture can be set to 0.68 or more occurs when the mark step difference is 0.1 μm or less and when the thickness of photosensitive material is 0.5 μm or less. When the mark step difference is low, its detection condition for outline emphasis is necessary to obtain position matching mark image with good contrast. On the other hand, the cases where numerical aperture can be set to 0.6 or less is when the mark step difference is approximately 0.8 μm and when the thickness of photosensitive material is approximately 1 μm, but when the mark step difference is high in such a case, a position matching mark image with sufficiently good contrast can be obtained utilizing the normal detection condition.

If the thickness of the photoresist on the wafer is to be changed, the type,(photosensitive wavelength) of photoresist may also be changed. For example, when the resist thickness is made thinner by changing the photoresist type the photosensitive wavelength of the photoresist on the wafer shifts to a shorter wavelength regime so that the non-photosensitive wavelength may shifted from 550–800 nm to 350–600 nm. In such a case, the wavelength range of the illumination light (ALA) for the wafer mark detection can be shortened from 550–800 nm to 350–600 nm. By making the wavelength shorter the contrast of the imaging signal obtained by imaging the low step difference mark is improved, and the detection accuracy of the low step difference mark can also be improved.

There are cases where the thickness of the photoresist on the wafer (resist thickness) is made thinner compared with the conventional case, but as the photoresist becomes thinner the target value for the integrated exposure quantity for the photoresist decreases in proportion to its thickness. For example, the resist thickness has been kept at approximately 1 μm or greater conventionally, and since the variation in the resist thickness was 0.01–0.02 μm (10–20 nm), so that the target value for integrated exposure quantity can be kept constant. However, for the cases in this example where the resist thickness is to be approximately 0.2 μm, as described above, the target value for the integrated exposure quantity needs to be corrected according to the variation in resist thickness. Therefore, there is a need for the resist thickness on the wafer (W) to be actually measured so that for this example resist thickness measurement unit 46 is mounted on the side of the projection exposure system (PL). This resist thickness measurement unit 46 is a device which images the equal thickness interference band at the resist layer supplying this imaging signal to the film thickness measurement calculation device 47. The film thickness measurement calculation device 47 calculates the thickness of the photoresist from the imaging signal and supplies the calculation result to the main control unit 29. The main control unit 29 corrects the target value for integrated exposure quantity according to the supplied thickness of the photoresist. Thus, an appropriate integrated exposure quantity can be obtained constantly.

An additional aspect of this embodiment, as described above, the numerical aperture (NA) of the projection exposure system (PL) is set to 0.5–0.6, σ diaphragm for annular illumination 75C or 75D is used, and alignment sensor for the high step difference mark is used when the resist thickness $T_R$ is approximately 1 μm or greater. The numerical aperture (NA) of the projection exposure system (PL) is set to 0.68–0.8, σ diaphragm for annular illumination 75A or 75B is used, and alignment sensor for the low step difference mark is used when the resist thickness $T_R$ is approximately 0.5 μm or less. Therefore, it is possible to switch the illumination condition or alignment sensor based on resist thickness $T_R$ in this embodiment. In this case, σ diaphragm for annular illumination 75C or 75D is used and an alignment sensor for the high step difference mark is used when the resist thickness $T_R$ is approximately 1 μm or greater. On the other hand, σ diaphragm for annular illumination 75A or 75B is used, and the alignment sensor for the low step difference mark is used when the resist thickness $T_R$ is approximately 0.5 μm or less. Thus, the illumination condition or alignment sensor can be optimized according to the thickness of the photoresist on the wafer.

It needs to be emphasized that this invention is not only applicable to cases where the exposure is carried out using the projection exposure device of the step-and-scan method, but can also be applied to cases where the exposure is carried out using collective exposure method such as a stepper. In other words, even in collective exposure method the resolution can be improved and alignment mark detected with high accuracy by switching the illumination condition or the detection condition of the alignment sensor based on the numerical aperture of the projection exposure system. Thus, this invention is not limited to the embodiments described above, but can take a variety of configuration within the range of the substance of this invention.

Figure 14:
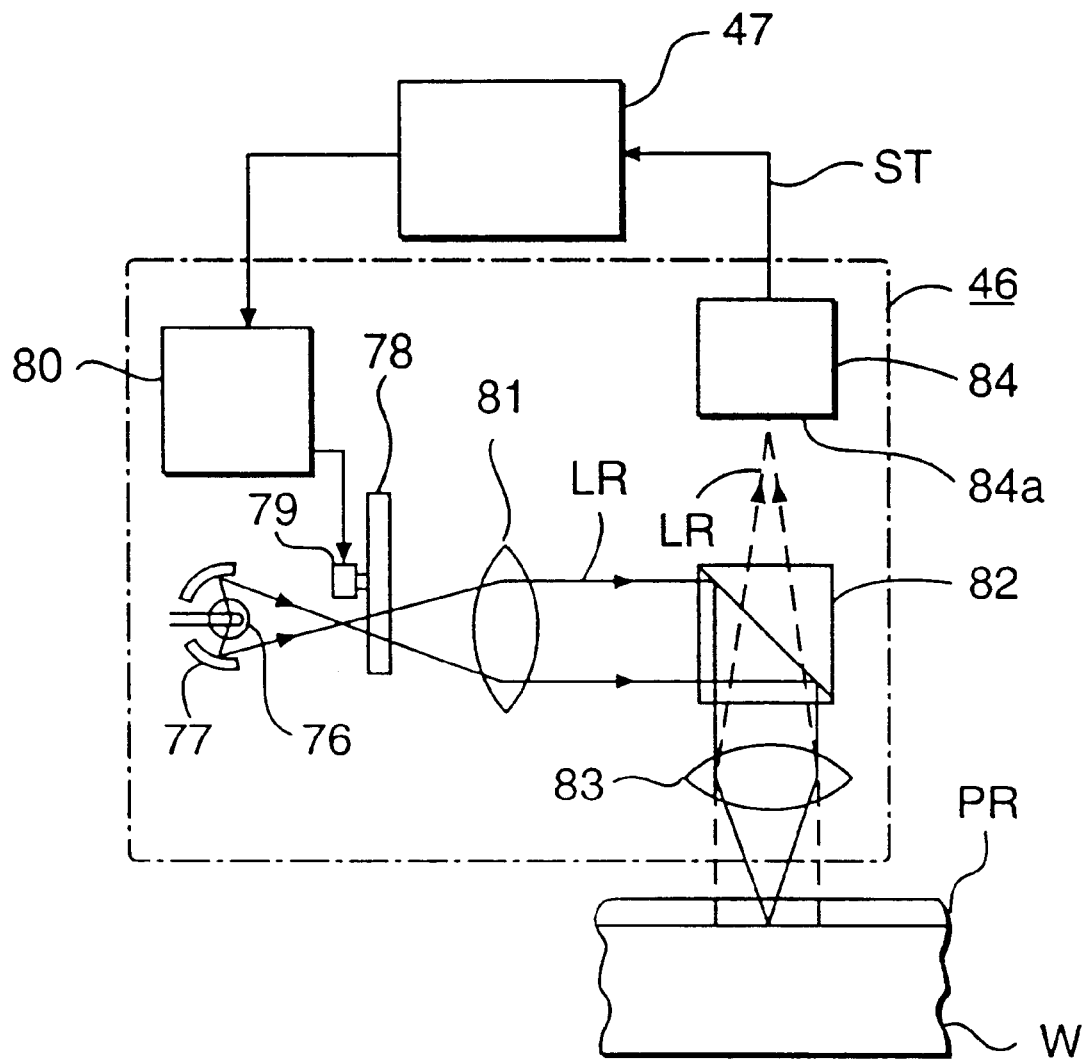
FIG. 14 is a schematic diagram depicting the resist thickness measurement device 46 in FIG. 1.

FIG. 14 is a schematic diagram showing the resist thickness measurement device 46. The illumination light emerging from the light source 76, such as lamp, is reflected by oval mirror 77 and incident on wavelength selection filter plate 78. A measurement light LR of a specific wavelength, which is non-photosensitive for the photoresist (PR) coated on the wafer (W), is selected by wavelength selection filter plate 78. By rotating wavelength selection filter plate 78 by drive mechanism 79 the wavelength of measurement light LR can be switched between multiple types. The action of drive mechanism 79 is controlled by the external film thickness measurement calculation device 47 by control system 80.

The measurement light transmitted through the wavelength selection filter plate 78 is converted into a parallel luminous flux by lens 81 and incident on half prism 82 and the measurement light reflected by half prism 82 forms the spot image within the photoresist (PR) of thickness (d) on the wafer by objective lens 38. The measurement light (IL) emitted by objective lens 83, of a constant numerical aperture, is reflected by the surface of the photoresist (PR) and the surface of the wafer W. The returning light LR' is incident on the imaging surface 84a of the imaging element 84 composed of two dimensional CCD by objective lens 83 and half prism 82. The imaging surface 84A of the imaging element 84 is the optical Fourier conversion plane (pupil plane) of the wafer (W) in regard to the objective lens 83, and interference band due to returning light LR' is formed on the imaging surface 84a. The imaging signal of the imaging element 84 is supplied to film thickness measurement calculation section 47, film thickness measurement calculation section 47 calculates the thickness d of the photoresist (PR) from the information on interference stripes obtained by processing the imaging signal, and then the calculation result is supplied to main control unit 29 of FIG. 1.

Figure 15A:
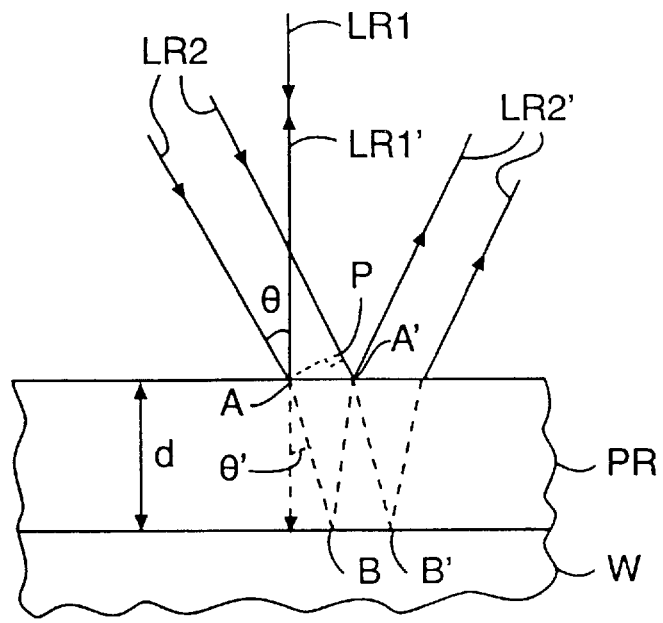
FIG. 15(a) depicts a partial expanded view indicating the optical path of the measurement light illuminating the wafer and photoresist from the resist thickness measurement device 46.
Figure 15B:
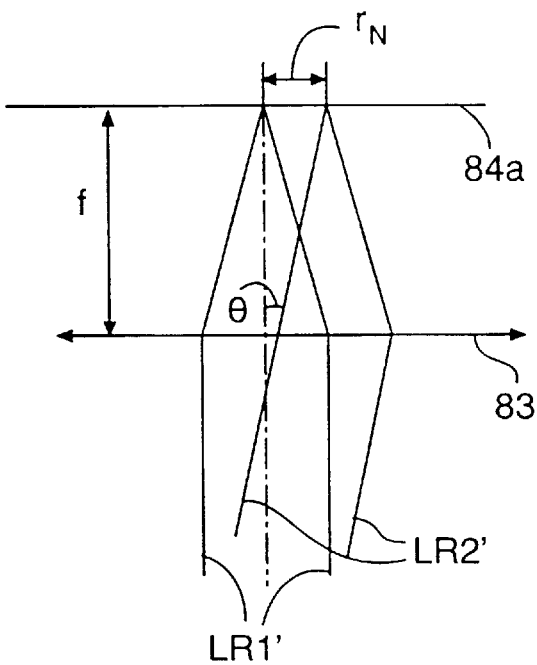
FIG. 15(b) depicts an optical path diagram indicating how the interference band is formed from the returning light from the wafer and photoresist on the imaging surface 84a of the imaging element.

FIG. 15(a) is a descriptive diagram of the measurement principles of thickness (d) of the photoresist indicates the reflection of the measurement light on the wafer (W) and photoresist (PR) surfaces LR1 and LR2 respectively. FIG. 15(b) shows the injection condition of the returning lights LR1' and LR2' into the imaging surface 84a corresponding to those measurement lights. In this case, the measurement light LR is a luminous flux possessing a designated numerical aperture and within this luminous flux the measurement light LR1 of FIG. 15(a) indicates the measurement light being injected normal to the surface of wafer (W). The measurement light LR2 indicates the measurement light incident on its surface at and injection angle of θ. The returning light LR2' reflected either by the wafer (W) or the photoresist (PR) is collected by the objective lens 83 on the imaging plane 84a on the specified circumference with the optical-axis as the center, as shown in FIG. 15(a) and 15(b).

In FIG. 15(a), if the refraction rate of the photoresist (PR) is designated as n the refraction angle θ' for the measurement light LR2 becomes as follows:

$$\sin \theta' = \sin \theta / n \quad (19)$$

The optical path difference Δ between the case where the measurement light LR2 is reflected directly on the surface A' of the photoresist (PR) and when it is reflected along the optical path connecting surface A of the photoresist PR, surface B of the wafer (W), and surface A' of the photoresist (PR) becomes:

$$\Delta = n(AB+BA')-A'P = 2nd/\cos\theta' - 2d\tan\theta'\sin\theta = 2nd/\cos\theta' - 2nd\tan\theta'\sin\theta' = 2nd\cos\theta \quad (20)$$

Note that the length of the optical path between surface A and surface B is represented by AB, and P is the crossing point of the normal line drawn from the surface A onto measurement light LR2 heading to surface A'.

Furthermore, since the refraction rate of the photoresist (PR) is greater than refraction rate of air and, if the phase shift π is considered, the phase difference δ between measurement light LR2, directly reflected on surface A', and measurement light LR2, reflected on the optical path connecting surface A, surface B, and surface A' becomes as follows.

$$\delta = (2\pi/\lambda_{LR})*\Delta + \pi \quad (21)$$

Note that the wavelength of measurement light LR is designated $\lambda_{LR}$.

When equation (20) is inserted into equation (2), it becomes:

$$\delta = (2\pi/\lambda_{LR}) 2nd \cos\theta' + \pi \quad (22)$$

The phase difference δ determines the brightness of the returning light (interference light) LR2' corresponding to the measurement light LR2. In other words, when the phase difference δ is (2N+1)π using an integer N of 1 or larger, its returning light LR2' becomes a dark interference stripe. For a number N dark interference stripe the following equation stands for the refraction angle θ' of the measurement light LR2:

$$(2N+1)\pi = \delta = (2\pi/\lambda_{LR}) 2nd \cos\theta' + \pi \quad (23)$$

And when equation (19) is inserted into equation (23), it becomes:

$$\theta'^2 = (n/2d)*(4nd - 2N\lambda_{LR}) \quad (24)$$

If the radius from the optical-axis, at the center for the Nth dark interference band on the imaging surface 84a of the imaging element 84, is designated $r_N$ and the focal distance of the objective lens 83 as f, then equation (24) becomes, where $\theta = r_N/f$:

$$r_N^2 = (n f^2/d)*(2n d - N\pi\lambda_{LR}) \quad (25)$$

When this equation is modified the thickness d of the photoresist can be obtained based on the radius $r_N$ of the N the dark interference band.

$$r_N^2 d = 2n^2 f^2 d - N\pi\lambda_{LR}, \quad (26)$$

$$d = (-n f^2 N\lambda_{LR})/(r_N^2 - 2n^2 f^2)$$

Figure 16A:
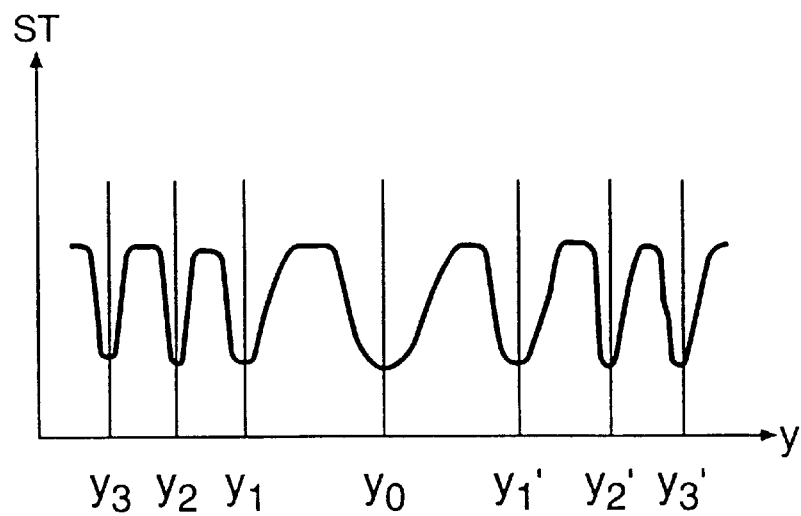
FIG. 16(a) depicts the interference band formed upon the imaging surface and the imaging signal corresponding to this interference band.
Figure 16B:
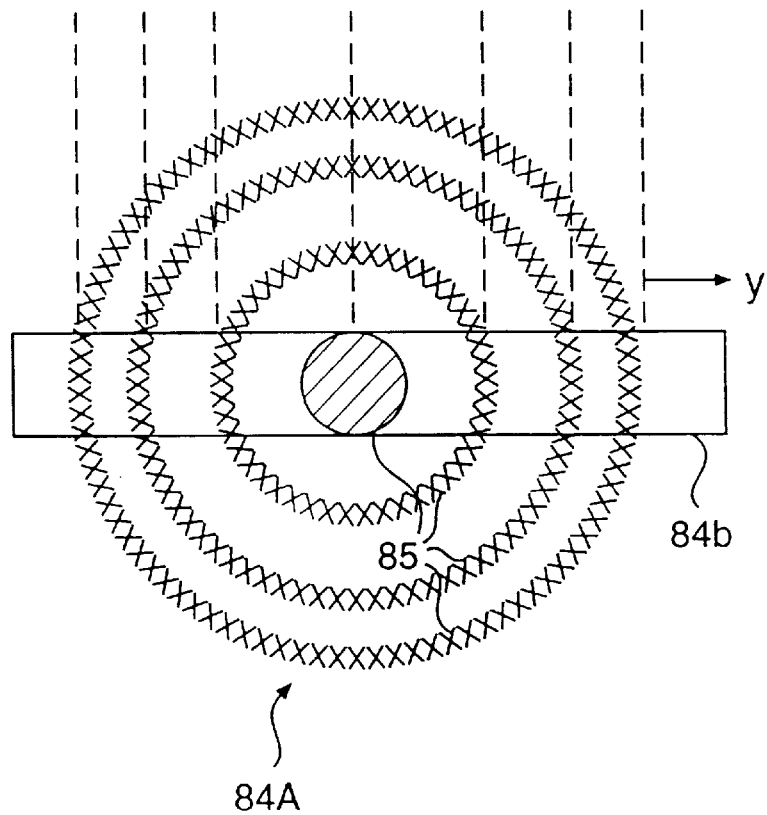
FIG. 16(b) depicts the interference bands, at the imaging surface 84a on the imaging element 84, of the returning light from the photoresist and the wafer and also shows the dark interference bands 85 formed in a concentric manner.

FIG. 16(b) shows the interference bands, at the imaging surface 84a on the imaging element 84, of the returning light from the photoresist (PR) and the wafer (W) and it also shows that the dark interference bands 85 are formed in a concentric manner. In this example, a rectangular detection region 84b, which is centered on the optical-axis on imaging surface 84A, is designated and the imaging signal corresponding to image intensity in the detection region 84b, is sequentially summed in the short edge direction. The summed image signal is shown as a function of the y-axis where the setting axis pass through the optical-axis on the imaging surface 84a and is parallel to the long side of the detection region 84b as the y-axis, and the origin of the y axis at the optical-axis.

FIG. 16(a) shows imaging signal ST summed in such manner and the positions of dips in the imaging signal ST in FIG. 16(a) $y_0, y_1, y_1', y_2, y_2', \ldots$ on the y-axis correspond to the positions of the dark interference bands described above. Therefore, the radius of the dark interference bands $r_1, r_2, \ldots, r_N$ for the first, second, . . . , Nth dark interference band is calculated and these radii are entered into equation (26) so that the photoresist thicknesses $d_1, d_2, \ldots, d_N$ are calculated and the averaged value of N number of thicknesses becomes the final thickness d. Thus the averaging effect is obtained and the thickness d of the photoresist (PR) is obtained at a high accuracy.

If the photoresist (PR), as shown in FIG. 14, which is the measurement object, is thin there becomes a need to select a light of short wavelength for measurement light LR, such that the photoresist (PR) would be not be sensitized. In this embodiment, when KrF excimer laser light with wavelength of 248 nm is used as exposure illumination light (IL), the use of an i-line with wavelength of 365 nm from the mercury lamp can be considered for use as the measurement light LR. However, the He—Ne laser light (wavelength 633 nm) can also be used as the measurement light LR. Note there is a need to use large numerical aperture for objective lens 83. Furthermore, while this embodiment detects dark interference bands there may be a need to detect bright interference bands when the photoresist (PR) is thick.

Next, an example of operation for controlling the exposure quantity by measuring the resist thickness on the wafer using the resist thickness measurement device 46 of this invention will be described. The thickness variation (coating unevenness) of the photoresist on the wafer differs depending on the management condition of the photoresist, and this will be described using the following classification.

Figure 17A:
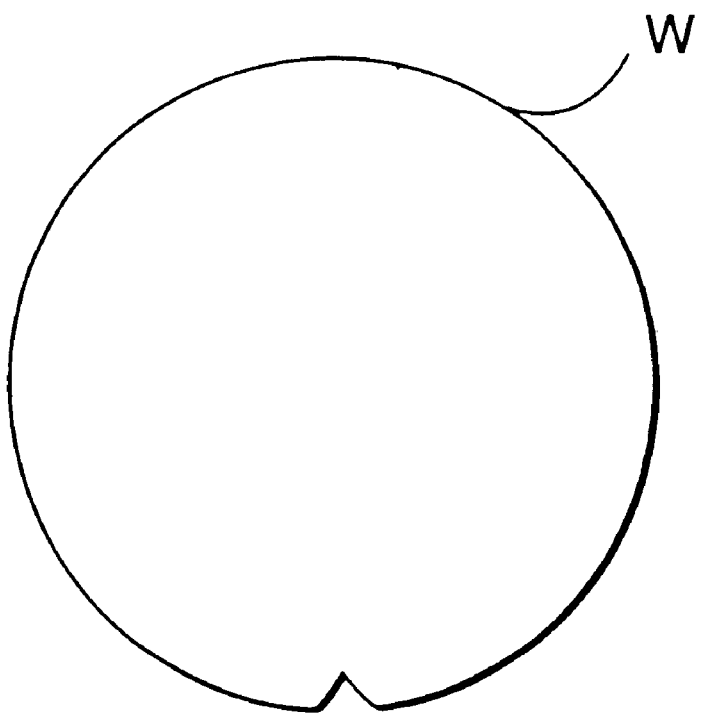
FIG. 17(a) is a planar view depicting the wafer coated with photoresist.
Figure 17B:
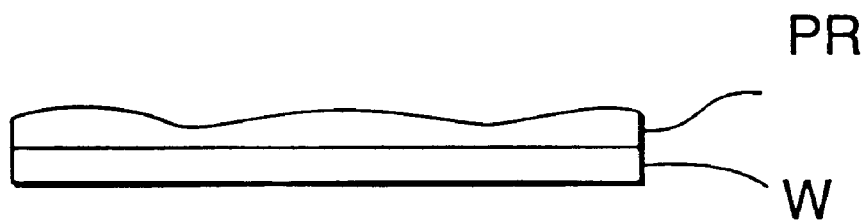
FIG. 17(b) is a side view depicting the wafer coated with photoresist.

First, FIG. 17 shows a case where there is thickness unevenness (coating unevenness) in the photoresist (PR) on the wafer (W). When the photoresist (PR) is thin as indicated in FIG. 17, the ratio of thickness unevenness against the average value of the thickness of the photoresist becomes large so that the target value for integrated exposure quantity may need to be modified locally. Therefore, when the photoresist is thinly coated on a single wafer and gradual thickness unevenness exit, there is a need to measure resist thickness for each shot area on the wafer using resist thickness measurement device 46.

Figure 18A:
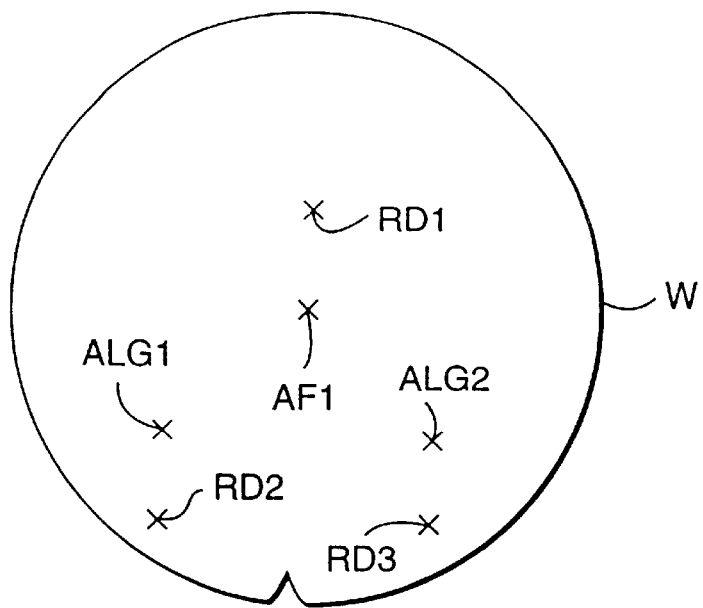
FIG. 18(a) is a planar view depicting the resist thickness on measurement point RD1–RD3 on the wafer.
Figure 18B:
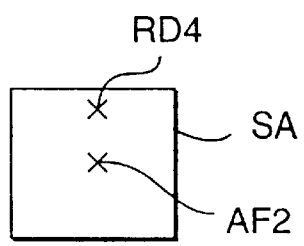
FIG. 18(b) is a planar view depicting the measurement point of the resist thickness RD4 in the shot area SA.

In practice, as indicated in FIG. 18(b), when the focus position at the central measuring point AF2 in the exposure target shot area SA, is measured using the focus position detection system 48, the resist thickness can be measured using resist thickness measurement device 46, at film thickness measurement point RD2 near the measurement point AF2, and this value is supplied to the main control unit 29. In this case, the main control unit 29, of FIG. 1 already has obtained the target value for integrated exposure quantity $E_0$, for resist thickness $d_0$, which is to be the standard, and if the difference from the standard value $d_0$ for the resist thickness $d_i$ measured at i-th shot area is given as $\Delta d_i$, then the target value for integrated exposure quantity $E_i$ can be obtained from equation (27).

$$E_i = E_0 + E_0(\Delta d_i/d_0) \tag{27}$$

This target value $E_i$, for the integrated exposure quantity, is supplied to the exposure quantity control system 31 which controls the beam attenuation rate at beam attenuation unit 2 depending upon the target value $E_i$.

If there are differences in the resist thickness between the manufacturing lots, the resist thickness is measured at multiple points on the leading wafer for the manufacture lot, and the average resist thickness d for the lot is obtained by averaging the measurement result. Next, the target value for the integrate exposure quantity for the wafer in the lot can be determined based on the difference between the resist thickness d and standard resist thickness. Also, when there is difference in resist thickness between the wafers in the same lot, the resist thickness can be measured during the search alignment step when the approximate position matching is carried out for each wafer. Additionally, during the search alignment step, the focus position at the designated measurement point is measured using the focal position detection system 48 in FIG. 1 and the focal position is matched to the imaging plane at the measurement points using an autofocus method.

FIG. 18(a) shows an example of the measurement point for the resist thickness when search alignment is carried out in such a manner where the measurement point for the autofocus focal position AF1 is set to the center of the wafer (W) and the measurement points for search alignment ALG1 and ALG2 are set at two locations on the wafer (W) surface and the marks for search alignment are formed at these measurement points ALG1 and ALG2. For example, position detection of the mark for search alignment can be carried out by the (FIA) system 51A, in FIG. 1. Furthermore, the resist thickness is measured at three film thickness measurement points RD1–RD3 surrounding the center of the wafer (W) where the resist thickness can be measured using resist thickness measurement device 46, using the average of this measured value at the resist thickness of the wafer (W) and the exposure quantity controlled based on this resist thickness.

Note that if the variation in the resist thickness is large it is desirable to control the exposure quantity within a single shot area based on the resist thickness. While it is difficult to control the exposure quantity locally in a collective exposure method, but for the scanning exposure method such as this embodiment, it becomes possible to carry out an exposure while correcting the exposure quantity by reading-ahead the resist thickness distribution within a single shot region. Therefore, the resist thickness should be read-ahead on measurement points at multiple rows within each shot area by equipping the multiple (e.g. 3) resist thickness measurement devices which would be the same as the resist thickness measurement device 46.

Figure 18C:
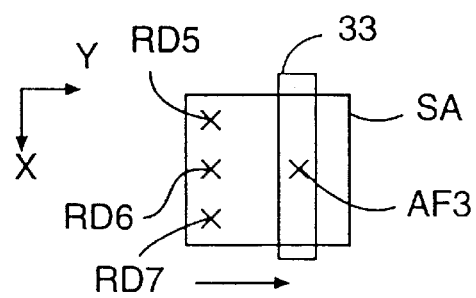
FIG. 18(c) is a planar view depicting the measurement points RD5–RD7 used when the resist thickness within shot area SA is read-ahead.

FIG 18(c) shows an example of film thickness measurement point when the resist thickness is read-ahead during such a scanning exposure. In FIG. 18(c), the shot area SA on the wafer is scanned, for example, in the +Y-direction against the slit-like exposure area 33 during scanning exposure. The focal position is then measured at multiple measurement points, including the measurement position AF3 in the center of the exposure area 33, by the focal position detection system 48, in FIG. 1, and, at the same time, on film thickness measurement points RD5, RD6, and RD7, which precedes the exposure area 33, the resist thickness is measured at a designated sampling period using the resist thickness measurement device similar to resist thickness measurement device 46, in FIG. 1. In this case, the averaged value of the resist thickness measured at the three film thickness measurement points RD5–RD7, are obtained as a function relating the position of the applicable shot area SA in the Y-direction. As the shot area SA moves in the Y-direction the exposure quantity is controlled by the exposure quantity control system 31, in FIG. 1, based on the resist thickness at position Y.

In order to respond accurately to the variation in the resist thickness within the shot area SA, the illuminance distribution in the non-scanning direction (X-direction) for the illumination light (IL) illuminating the reticle (R), in FIG. 1, can be controlled, in addition to controlling the exposure quantity based on the shot area SA position in Y-direction. In other words, of the three film measurement points RD5, RD6, and RD7, if the resist thickness at the edge section film thickness measurement point RD5 is thicker than the other measurement points (i.e. the necessary exposure quantity is large), it is desirable that the illuminance of the illumination light be increased in the vicinity of this thickness measurement point RD5. When the illuminance distribution of the illumination light is controlled somewhat, in the non-scanning direction, the illuminance distribution correction plate 9, in FIG. 1, is used. Since this illuminance distribution correction plate 9 is placed in the vicinity of the pupil plane of the pattern formation surface of the reticle (R), the illuminance distribution on the reticle (R) can be controlled by controlling the illuminance distribution depending on the inclination angle in the non-scanning direction of the illumination light.

Figure 19A:
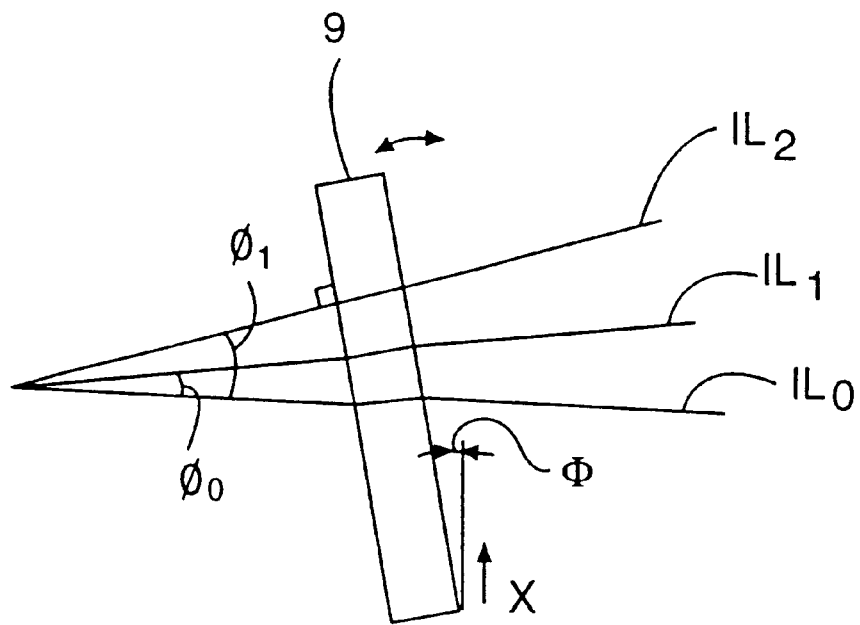
FIG. 19(a) is a planar view depicting illuminance distribution correction plate 9 in FIG. 1.
Figure 19B:
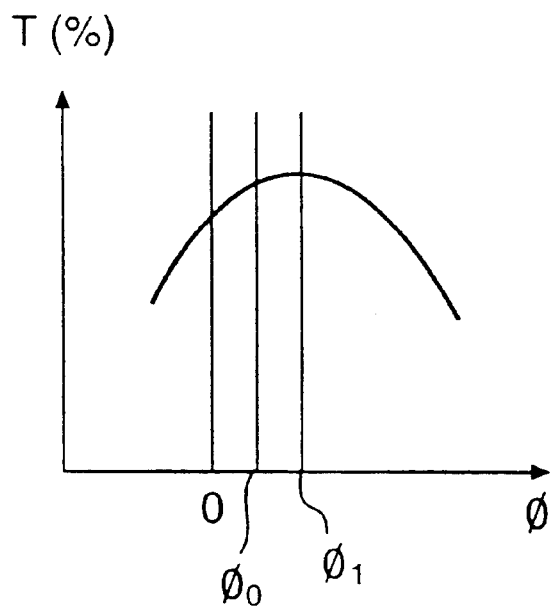
FIG. 19(b) is a depicts the transmission rate T for the inclination angle of the illumination light incident on illuminance distribution correction plate 9.

FIG. 19(*a*) indicates that the illuminance distribution correction plate 9 is placed in the optical path of the illumination light emitted from the flyeye lens 7 (or input optical system 5B), in FIG. 1. The up-down direction along the sheet surface on FIG. 19(*a*) is the direction corresponding to the non-scanning direction (X-direction ) of the wafer, while the illuminance distribution correction plate 9 comprised of parallel plate glass is supported so that it can rotate freely around the axis normal to the sheet surface of FIG. 19(*a*). It is so composed that its rotational angle $\Phi$ (which is =0 when it is parallel to the X-direction) around its axis is controlled by the illumination system control system 32.

In FIG. 19(*a*) illumination lights $IL_1$ and $IL_2$ are considered, which are inclined at angles $\Phi_0$ and $\Phi_1$ ($\Phi_1 > \Phi_0$) in the X-direction from the illumination light $IL_0$, which is along the optical-axis of the illumination optical system. It is also assumed that illumination light $IL_1$ whose angle $\Phi_1$ is the equation to $\Phi$, is at a normal incidence to the illuminance distribution correction plate 9. In general, since the transmission rate decreases as the incidence angle increases for parallel plate glass the transmission rate for illuminance distribution correction plate 9 changes for illumination light $IL_0$–$IL_2$.

FIG. 19(*b*) shows the transmission rate for the illumination light by illuminance distribution correction plate 9, where the horizontal axis shows the inclination angle in the non-scanning direction (x-direction) of the illumination light which is incident on illuminance distribution correction plate 9, while the vertical axis shows the transmission rate T (%) for the illumination light at that inclination angle $\Phi$. The illumination light where the inclination angle $\Phi$ is 0, $\Phi_0$, and $\Phi_1$ correspond to the illumination light $IL_0$, $IL_1$, in FIG. 19(*b*), and $IL_2$ in FIG. 19(*a*). In this case, since the illumination light $IL_2$ is injected normal to the illuminance distribution correction plate 9, the transmission rate T for the illumination light $IL_2$ becomes the highest and the illuminance for illumination light $IL_2$ becomes the largest. Therefore, by rotating the illuminance distribution correction plate 9 at the inclination angle in matching the direction where the maximum illuminance of the illumination light is desired the illuminance of the illumination light in that direction can be maximized.

Since the wafer is scanned in the Y-direction for the exposure region, the variation in illuminance distribution of the illumination light in the scanning direction (Y-direction) does not become a problem. However, the illuminance distribution can be controlled by inclining the illuminance distribution correction plate 9 in the Y-direction as well according to necessity.

As described above, this embodiment measures the thickness of the photoresist or its distribution and controls the exposure quantity according to its thickness so that even when the photoresist is only thinly coated, an appropriate integrated exposure quantity can be given for that photoresist. Measurement of the resist thickness on the wafer is carried out during search alignment measurement, autofocus measurement, or scanning exposure and there is no time set aside specifically to carry out resist thickness measurement, so that no reduction in throughput of the exposure process (productivity) results.

In the above example, the resist thickness measurement device 46, which measures the resist thickness, is placed within the projection exposure device. It is also possible to measure the resist thickness using a resist thickness measurement device placed in the middle of the path as the wafer is being transported from the resist coater to its projection exposure device, entering this value online or manually into the memory of the main control unit within the projection exposure device as a data file, and controlling the integrated exposure quantity based on that information.

While the illuminance of the illumination light (integrated exposure quantity) is corrected optically using beam attenuation unit 2, in the embodiment described above, it can also be corrected by changing the exposure pulse number or the pulse energy of the KrF excimer laser light source 1 as the exposure light source for each point on the wafer. Otherwise, the integrated exposure quantity can also be controlled by controlling the width in the scanning direction of the slit-like illumination region 33 on the reticle (R) by driving the fixed field diaphragm 18 or movable field diaphragm 20. Furthermore, the integrated exposure quantity can also be minutely adjusted by changing the scanning speed.

This invention is not limited only applicable to cases where exposure is carried out using projection exposure device of step-and-scan method, but also is used where exposure can be carried out using a collective exposure method such as a stepper. In other words, even for the collective exposure method, the resolution can be improved and the condition regarding the permissible range of the depth of focus satisfied by making the resist thickness thinner and increasing the numerical aperture of the projection exposure system by measuring the resist thickness to obtain the optimal integrated exposure quantity. Thus, this invention is not limited to the embodiments described above, but can take variety of compositions within the range of the substance of this invention.

According to the third exposure method of this invention, since the integrated exposure quantity is controlled according to the thickness of the photosensitive material coated on the circuit board, the optimal integrated exposure quantity can be given for the photosensitive material based on the measured thickness even when the photosensitive material is made thin and variation exist in the thickness of the photosensitive material within the circuit board, between the circuit boards, or between lots. Also, when the projection exposure system is used, the condition regarding the permissible range of the depth of focus is still satisfied even when the numerical aperture of the projection exposure system is increased when the resist thickness is made thinner. Therefore, there is a benefit in that the resolution of the pattern to be transferred can be improved without making the exposure illumination light wavelength shorter by increasing the numerical aperture and making the photosensitive material thinner. Furthermore, this invention provides an optimal integrated exposure quantity even if the thickness varies when the photosensitive material is made thinner.

There is also a benefit in that the optimal integrated exposure quantity can be easily calculated even when there is a variation in the thickness of the photosensitive material by storing in memory the optimal integrated exposure quantity obtained beforehand, for the photosensitive material, at a designated standard thickness corresponding to the mask, by calculating the difference of the thickness of the photosensitive material from the designated thickness and by setting the integrated exposure quantity of the exposure illumination light based on this difference.

If the transfer pattern on the mask is projection exposed onto the circuit board by the projection exposure system it is possible to transfer with high accuracy a circuit pattern corresponding to the next generation of semiconductor devices. This is accomplished by making the thickness of the photosensitive material coated on the circuit board 0.5 $\mu$m or less and setting the numerical aperture of the projection exposure system to 0.68 or greater, without shortening the wavelength for the exposure illumination light. In other words, it becomes possible to form patterns corresponding to the next generation 256 M-bit DRAM using the i-line of the mercury lamps, patterns corresponding to a 1 G-bit DRAM using KrF excimer laser light, and patterns corresponding to a 4 G-bit DRAM using an ArF excimer laser light.

According to the fourth exposure method of this invention, since the control of switching of the numerical aperture of the projection exposure system is carried out based on the thickness of the photosensitive material coated on the circuit board, the resolution can be improved and the condition regarding the permissible range of the depth of focus satisfied by increasing the numerical aperture when the photosensitive material is thin. There is the benefit of being able to deal with the pattern at different resolution by decreasing the numerical aperture and carrying out the transfer at a low resolution when the photosensitive material is thick. For example, by setting the numerical aperture to 0.7 or greater when the thickness of the photosensitive material is 0.2 $\mu$m or less, or setting the the numerical aperture to 0.6 or less when the thickness of the photosensitive material is 1.0 $\mu$m or greater, it can deal with two generations of semiconductor devices can be accommodated by the optical prosecution system. Thus, it becomes possible to form a pattern corresponding to two generations of semiconductor devices with one exposure device without changing the wavelength of the exposure illumination light so that the process management for the exposure device previously carried out for a separate line can be reduced to just one device. Therefore, process management becomes easier and the process management time is shortened so that the throughput for the exposure process is increased.

It will be apparent to those skilled in the art that various modifications and variations can be made in the projection exposure apparatus and method of the present invention without departing from the spirit or scope of the invention. Thus, it is intended that the present invention and the modifications and variations of this invention provided they come withing the scope of the appended claims and their equivalents.

What is claimed is:

1. A method for manufacturing a projection exposure apparatus that exposes a pattern formed on a mask onto a substrate, the method comprising the steps of:
    providing a projection optical system having a numerical aperture greater than about 0.7 on an optical-axis between the mask and the substrate; and
    providing an illumination system, which is arranged on the optical axis at an opposite side of the projection optical system with respect to the mask, and which illuminates the pattern formed on the mask with an illumination beam so that the pattern is projected onto the substrate treated by a planarization process through the projection optical system.

2. The method according to claim 1, wherein the substrate is treated by the planarization process so that a step-difference of a base pattern on the substrate is equal to or less than about 0.1 $\mu$m, and a photosensitive material is coated on the substrate with a thickness equal to or less than about 0.5 $\mu$m.

3. The method according to claim 1, wherein the numerical aperture is equal to or less than about 0.81.

4. The method according to claim 3, wherein the numerical aperture is equal to or less than about 0.74.

5. The method according to claim 3, wherein a photosensitive material is coated on the substrate with a thickness less than about 0.5 $\mu$m.

6. The method according to claim 1, wherein the illumination beam includes one of a KrF excimer laser beam and an ArF excimer laser beam.

7. The method according to claim 1, wherein the mask has a mark, and the mark is exposed onto the substrate by illuminating the mark on the mask, the method further comprising the step of providing a detector which detects the mark exposed onto the substrate using a two-luminous flux interference method.

8. The method according to claim 1, wherein the exposure apparatus includes a scanning exposure apparatus which exposes the pattern onto the substrate while the mask and the substrate are relatively scanned.

9. The method according to claim 1, wherein the illumination system illuminates the pattern formed on the mask with a normal illumination condition, the normal illumination condition having a light quantity distribution in which a light quantity of a center region is greater than that of a peripheral region at an illumination pupil plane of the illumination system.

10. A method for manufacturing a projection exposure apparatus that exposes a pattern formed on a mask onto a substrate, the method comprising the steps of:
    providing a projection optical system having a numerical aperture greater than about 0.7 on an optical-axis between the mask and the substrate; and
    providing an illumination system, which is arranged on the optical axis at an opposite side of the projection optical system with respect to the mask, and which illuminates the pattern formed on the mask with an illumination beam so that the pattern is projected onto the substrate, a photosensitive material having been coated on the substrate with a thickness equal to or less than about 0.5 $\mu$m.

11. The method according to claim 10, wherein the numerical aperture is equal to or less than about 0.81.

12. The method according to claim 11, wherein the numerical aperture is equal to or less than about 0.74.

13. The method according to claim 11, wherein the thickness of the photosensitive material is equal to or less than about 0.2 $\mu$m.

14. The method according to claim 10, wherein the illumination beam includes one of a KrF excimer laser beam and an ArF excimer laser beam.

15. The method according to claim 10, wherein the mask has a mark, and the mark is exposed onto the substrate by illuminating the mark on the mask, the method further comprising the step of providing a detector which detects the mark exposed onto the substrate using a two-luminous flux interference method.

16. The method according to claim 10, wherein the exposure apparatus includes a scanning exposure apparatus which exposes the pattern onto the substrate while the mask and the substrate are relatively scanned.

17. The method according to claim 10, wherein the illumination system illuminates the pattern formed on the mask under a normal illumination condition in which the light quantity distribution at an illumination pupil plane of the illumination system includes an optical-axis.

18. The method according to claim 10, wherein the mask has a mark which is exposed onto the substrate by illuminating, the method further comprising the steps of:
providing a detecting system, which is arranged at the substrate side of the projection optical system, and which detects a mark formed on the substrate; and
providing a setting portion, which is electrically connected to the detecting portion, and which sets an illumination condition of the detecting system to a modified illumination condition, the modified illumination condition having a light quantity distribution in which a light quantity of a center region is smaller than that of a peripheral region at an illumination pupil plane of the illumination system, the detecting system detecting the mark under the modified illumination condition.

19. A projection exposure apparatus that exposes a pattern formed on a mask onto a substrate, comprising:
a projection optical system which is arranged on an optical-axis between the mask and the substrate and which has a numerical aperture greater than about 0.7; and
an illumination system, which is arranged on the optical axis at an opposite side of the projection optical system with respect to the mask, and which illuminates the pattern formed on the mask with an illumination beam so that the pattern is projected onto the substrate treated by a planarization process through the projection optical system.

20. The apparatus according to claim 19, wherein the substrate is treated by the planarization process so that a step-difference of a base pattern on the substrate is equal to or less than about 0.1 $\mu$m, and a photosensitive material is coated on the substrate with a thickness equal to or less than about 0.5 $\mu$m.

21. The apparatus according to claim 19, wherein the numerical aperture is equal to or less than about 0.81.

22. The apparatus according to claim 21, wherein the numerical aperture is equal to or less than about 0.74.

23. The apparatus according to claim 21, wherein a photosensitive material is coated on a substrate with a thickness less than about 0.5 $\mu$m.

24. The apparatus according to claim 19, wherein the illumination beam includes one of a KrF excimer laser beam and an ArF excimer laser beam.

25. The apparatus according to claim 19, wherein the mask has a mark, and the mark is exposed onto the substrate by illuminating the mark on the mask, the apparatus further comprising a detector which detects the mark exposed onto the substrate using a two-luminous flux interference method.

26. The apparatus according to claim 19, wherein the exposure apparatus includes a scanning exposure apparatus which exposes the pattern onto the substrate while the mask and the substrate are relatively scanned.

27. The apparatus according to claim 19, wherein the illumination system illuminates the pattern formed on the mask with a normal illumination condition, the normal illumination condition having a light quantity distribution in which a light quantity of a center region is greater than that of a peripheral region at an illumination pupil plane of the illumination system.

28. A micro device manufactured by transferring the pattern formed on the mask onto the substrate using the exposure apparatus of claim 19.

29. A projection exposure apparatus that exposes a pattern formed on the mask onto a substrate, comprising:
a projection optical system which is arranged on an optical-axis between the mask and the substrate and which has a numerical aperture greater than about 0.7; and
an illumination system, which is arranged on the optical axis at an opposite side of the projection optical system with respect to the mask, and which illuminates the pattern formed on the mask with an illumination beam so that the pattern is projected onto the substrate, a photosensitive material having been coated on the substrate with a thickness equal to or less than about 0.5 $\mu$m.

30. The apparatus according to claim 29, wherein the numerical aperture is equal to or less than about 0.81.

31. The apparatus according to claim 30, wherein the numerical aperture is equal to or less than about 0.74.

32. The apparatus according to claim 30, wherein the thickness of the photosensitive material is equal to or less than about 0.2 $\mu$m.

33. The apparatus according to claim 29, wherein the illumination beam includes one of a KrF excimer laser beam and an ArF excimer laser beam.

34. The apparatus according to claim 29, wherein the mask has a mark, and the mark is exposed onto the substrate by illuminating the mark on the mask, the apparatus further comprising a detector which detects the mark exposed onto the substrate using a two-luminous flux interference method.

35. The apparatus according to claim 29, wherein the exposure apparatus includes a scanning exposure apparatus which exposes the pattern onto the substrate while the mask and the substrate are relatively scanned.

36. The apparatus according to claim 29, wherein the illumination system illuminates the pattern formed on the mask with a normal illumination condition, the normal illumination condition having a light quantity distribution in which a light quantity of a center region is greater than that of a peripheral region at an illumination pupil plane of the illumination system.

37. The apparatus according to claim 29, wherein the mask has a mark which is exposed onto the substrate by illuminating, the apparatus further comprising:
a detecting system which is arranged at the substrate side of the projection optical system and which detects a mark formed on the substrate; and
a setting portion, which is electrically connected to the detecting portion, and which sets an illumination condition of the detecting system to a modified illumination condition, the modified illumination condition having a light quantity distribution in which a light quantity of a center region is smaller than that of a peripheral region at an illumination pupil plane of the illumination system, the detecting system detecting the mark under the modified illumination condition.

38. A micro device manufactured by transferring the pattern formed on the mask onto the substrate using the exposure apparatus of claim 29.

39. A projection exposure apparatus which exposes a substrate with a pattern formed on a mask, comprising:
- a projection optical system, which is arranged on an optical-axis between the mask and the substrate, and which has a numerical aperture greater than about 0.7; and
- an illumination system, which is arranged on the optical-axis at an opposite side of the projection optical system with respect to the mask, and which illuminates the pattern formed on the mask with an illumination beam so that the pattern is projected onto the substrate through the projection optical system,
- wherein the illumination system illuminates the pattern formed on the mask under a normal illumination condition in which a light quantity distribution at an optical Fourier conversion place of a formation surface of the pattern formed on the mask in the illumination system of a center region including the optical axis is higher than that of an outside region outside of the center region.

40. The apparatus according to claim 39, wherein the illumination system has an aperture member in which the center region including the optical axis is an aperture, and the normal illumination condition is set by the aperture member.

41. The apparatus according to claim 39, wherein the illumination beam includes an excimer laser beam.

42. The apparatus according to claim 41, wherein the excimer laser beam includes one of a KrF excimer laser beam and an ArF excimer laser beam.

43. The apparatus according to claim 42, wherein the numerical aperture of the projection optical system is set equal to or less than about 0.81.

44. The apparatus according to claim 41, wherein the excimer laser beam includes a KrF excimer laser beam, and the numerical aperture of the projection optical system is set equal to or less than about 0.74.

45. The apparatus according to claim 41, wherein the excimer laser beam includes an ArF excimer laser beam, and the numerical aperture of the projection optical system is set to about 0.73.

46. A projection exposure apparatus which exposes a substrate with a pattern formed on a mask, comprising:
- a light source which generates an excimer laser beam;
- a projection optical system, which is arranged on an optical-axis between mask and substrate, and which has a numerical aperture greater than about 0.7; and
- an illumination system, which is arranged on the optical-axis at an opposite side of the projection optical system with respect to the mask, and which illuminates the pattern formed on the mask with the excimer laser beam so that the pattern is projected onto the substrate through the projection optical system.

47. The apparatus according to claim 46, wherein the excimer laser beam includes one of a KrF excimer laser beam and an ArF excimer laser beam.

48. The apparatus according to claim 47, wherein the numerical aperture of the projection optical system is set equal to or less than about 0.81.

49. The apparatus according to claim 46, wherein the excimer laser beam includes a KrF excimer laser beam, and the numerical aperture of the projection optical system is set equal to or less than about 0.74.

50. The apparatus according to claim 46, wherein the excimer laser beam includes an ArF excimer laser beam, and the numerical aperture of the projection optical system is set to about 0.73.

51. A projection exposure apparatus which exposes a substrate having a mark with a pattern formed on a mask, comprising:
- a projection optical system, which is arranged on an optical-axis between the mask and the substrate, and which has a numerical aperture greater than about 0.7; and
- an illumination system, which is arranged on the optical-axis at an opposite side of the projection optical system with respect to the mask, and which illuminates the pattern formed on the mask with an illumination beam so that the pattern is projected onto the substrate through the projection optical system.

52. The apparatus according to claim 51, wherein the illumination beam includes an excimer laser beam.

53. The apparatus according to claim 52, wherein the excimer laser beam includes a KrF excimer laser beam, and the numerical aperture of the projection optical system is set equal to or less than about 0.74.

54. The apparatus according to claim 52, wherein the excimer laser beam includes an ArF excimer laser beam, and the numerical aperture of the projection optical system is set to about 0.73.

55. The apparatus according to claim 51, wherein the excimer laser beam includes one of a KrF excimer laser beam and an ArF excimer laser beam.

56. The apparatus according to claim 55, wherein the numerical aperture of the projection optical system is set equal to or less than about 0.81.

57. A method for manufacturing a projection exposure apparatus which exposes a substrate with a pattern formed on a mask, the method comprising of steps of:
- providing a projection optical system, which is arranged on an optical-axis between the mask and the substrate, and which has a numerical aperture greater than about 0.7; and
- providing an illumination system, which is arranged on the optical-axis at an opposite side of the projection optical system with respect to the mask, and which illuminates the pattern formed on the mask with an illumination beam so that the pattern is projected onto the substrate through the projection optical system,
- wherein the illumination system illuminates the pattern formed on the mask under a normal illumination condition in which a light quantity distribution at an optical Fourier conversion place of a formation surface of the pattern formed on the mask in the illumination system of the center region having the optical axis is higher than that of an outside region outside of the center region.

58. The method according to claim 57, wherein the illumination beam includes one of a KrF excimer laser beam and an ArF excimer laser beam, and the numerical aperture of the projection optical system is set equal to or less than about 0.81.

59. The method according to claim 58, wherein the illumination beam includes a KrF excimer laser beam, and the numerical aperture of the projection optical system is set equal to or less than about 0.74.

60. The method according to claim 58, wherein illumination beam includes an ArF excimer laser beam, and the numerical aperture of the projection optical system is set to about 0.73.

61. A method for manufacturing a projection exposure apparatus which exposes a substrate with a pattern formed on a mask, the method comprising of steps of:

provided a light source which generates an excimer laser beam;

providing projection optical system, which is arranged on an optical-axis between the mask and the substrate, and which has a numerical aperture greater than about 0.7; and providing an illumination system, which is arranged on the optical-axis at an opposite side of the projection optical system with respect to the mask, and which illuminates the pattern formed on the mask with the excimer laser beam so that the pattern is projected onto the substrate through the projection optical system.

62. The method according to claim 61, wherein the excimer laser beam includes one of a KrF excimer laser beam and an ArF excimer laser beam, and the numerical aperture of the projection optical system is set equal to or less than about 0.81.

63. The method according to claim 61, wherein the excimer laser beam includes a KrF excimer laser beam, and the numerical aperture of the projection optical system is set equal to or less than about 0.74.

64. The method according to claim 61, wherein the excimer laser beam includes an ArF excimer laser beam, and the numerical aperture of the projection optical system is set to about 0.73.

65. A method for manufacturing a projection exposure apparatus which exposes a substrate having a mark with a pattern formed on a mask, the method comprising steps of:

providing a projection optical system, which is arranged on an optical-axis between the mask and the substrate, and which has a numerical aperture greater than about 0.7; and providing an illumination system, which is arranged on the optical-axis at an opposite side of the projection optical system with respect to the mask, and which illuminates the pattern formed on the mask with an illumination beam so that the pattern is projected onto the substrate through the projection optical system.

66. The method according to claim 65, wherein the illumination beam includes an excimer laser beam, and the numerical aperture of the projection optical system is set equal to or less than about 0.81.

67. The method according to claim 66, wherein the excimer laser beam includes a KrF excimer laser beam, and the numerical aperture of the projection optical system is set equal to or less than about 0.74.

68. The method according to claim 66, wherein the excimer laser beam includes an ArF excimer laser beam, and the numerical aperture of the projection optical system is set to about 0.73.

* * * * *